US012681389B2

(12) United States Patent
Shimizu et al.

(10) Patent No.: US 12,681,389 B2
(45) Date of Patent: Jul. 14, 2026

(54) EUV RESIST UNDERLAYER FILM-FORMING COMPOSITION

(71) Applicant: NISSAN CHEMICAL CORPORATION, Tokyo (JP)

(72) Inventors: Shou Shimizu, Toyama (JP); Mamoru Tamura, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 672 days.

(21) Appl. No.: 18/017,977

(22) PCT Filed: Aug. 20, 2021

(86) PCT No.: PCT/JP2021/030487
§ 371 (c)(1),
(2) Date: Jan. 25, 2023

(87) PCT Pub. No.: WO2022/039246
PCT Pub. Date: Feb. 24, 2022

(65) Prior Publication Data
US 2023/0296984 A1 Sep. 21, 2023

(30) Foreign Application Priority Data
Aug. 21, 2020 (JP) ................................ 2020-140060

(51) Int. Cl.
*G03F 7/11* (2006.01)
*C08G 63/688* (2006.01)
*H10P 76/20* (2026.01)

(52) U.S. Cl.
CPC .............. *G03F 7/11* (2013.01); *C08G 63/688* (2013.01); *H10P 76/2041* (2026.01)

(58) Field of Classification Search
CPC ......... G03F 7/11; G03F 7/0395; G03F 7/0397
See application file for complete search history.

(56) References Cited

U.S. PATENT DOCUMENTS

| | | | | |
|---|---|---|---|---|
| 2004/0048196 | A1 | 3/2004 | Shao | |
| 2010/0266951 | A1 | 10/2010 | Hiroi et al. | |
| 2011/0053091 | A1 | 3/2011 | Hiroi et al. | |
| 2012/0315765 | A1 | 12/2012 | Nakajima et al. | |
| 2014/0004465 | A1* | 1/2014 | Ohnishi ............ | C08G 59/1455 430/296 |
| 2015/0159045 | A1 | 6/2015 | Kanno et al. | |
| 2018/0335698 | A1 | 11/2018 | Nakajima et al. | |
| 2019/0354018 | A1* | 11/2019 | Tokunaga .......... | C08G 73/1078 |

FOREIGN PATENT DOCUMENTS

| | | | |
|---|---|---|---|
| EP | 2 055 734 | A2 | 5/2009 |
| JP | 2001-092122 | A | 4/2001 |
| JP | 2004-533637 | A | 11/2004 |
| JP | 2015-051972 | A | 3/2015 |
| KR | 10-2010-0077669 | A | 7/2010 |
| WO | 2009/075265 | A1 | 6/2009 |
| WO | 2009/096340 | A1 | 8/2009 |
| WO | 2013/191203 | A1 | 12/2013 |
| WO | 2016/080226 | A1 | 5/2016 |

OTHER PUBLICATIONS

Oct. 12, 2021, International Search Report issued in International Patent Application No. PCT/JP2021/030487.
Feb. 16, 2023, International Preliminary Report on Patentability issued in International Search Report PCT/JP2021/030487.
Aug. 13, 2023 Office Action issued in Chinese Patent Application No. 202180051243.6.

* cited by examiner

*Primary Examiner* — Daborah Chacko-Davis
(74) *Attorney, Agent, or Firm* — Oliff PLC

(57) ABSTRACT

A composition for forming a resist underlayer film that enables formation of an intended resist pattern, and a method for producing a resist pattern and a method for producing a semiconductor device, each of which uses said composition for forming a resist underlayer film. A composition for forming an EUV resist underlayer film includes: a compound represented by formula (1); a polymer; and an organic solvent. (In formula (1), Y1 represents a single bond, an oxygen atom, a sulfur atom, a halogen atom, or a C1-10 alkylene group which may be substituted with a C6-40 aryl group, or a sulfonyl group, T1 and T2 each represent a C1-10 alkyl group, R1 and R2 each independently represent a C1-10 alkyl group which is substituted with at least one hydroxy group, and n1 and n2 each independently represent an integer of 0-4).

8 Claims, No Drawings

EUV RESIST UNDERLAYER FILM-FORMING COMPOSITION

FIELD OF INVENTION

The present invention relates to a composition used in a lithography process for the semiconductor production, particularly in a cutting-edge lithography (e.g., ArF, EUV, or EB lithography) process. In addition, the present invention relates to a method for producing a substrate having a resist pattern using the resist underlayer film and a method for producing a semiconductor device.

BACKGROUND ART

In the production of semiconductor devices, microfabrication by lithography using a resist composition has conventionally been conducted. The microfabrication is a fabrication method in which a thin film of a photoresist composition is formed on a semiconductor substrate, such as a silicon wafer, and irradiated with an active ray of light, such as an ultraviolet light, through a mask pattern having a pattern for a device, and subjected to development, and the substrate is subjected to etching treatment using the obtained photoresist pattern as a protective film, forming very small unevenness corresponding to the pattern in the surface of the substrate. In recent years, semiconductor devices have further been increased in the integration degree, and, with respect to the active ray of light used for microfabrication, an i-line (wavelength: 365 nm), a KrF excimer laser (wavelength: 248 nm), and an ArF excimer laser (wavelength: 193 nm) have been conventionally used, and further the practical use of an EUV light (wavelength: 13.5 nm) or an EB (electron beam) in the most advanced microfabrication is being studied. For controlling the form of the resist pattern, a method of forming a resist underlayer film layer between a resist and a semiconductor substrate has been widely used.

Patent Literature 1 discloses a resist underlayer film-forming composition containing a sulfur atom. Patent Literature 2 discloses a resist underlayer film-forming composition comprising a polymer having a structure containing an aromatic ring.

CITATION LIST

Patent Literature

Patent Literature 1: WO 2009/096340 A1

Patent Literature 2: WO 2009/075265 A1

SUMMARY OF INVENTION

Technical Problem

The properties required for the resist underlayer film include, for example, that intermixing of the resist underlayer film with a resist film formed thereon does not occur (the resist underlayer film is insoluble in a resist solvent); that the resist underlayer film has a high dry etching rate, as compared to the resist film; and that a sublimate generated when forming (baking) the resist underlayer film is reduced.

In the lithography using EUV exposure, the resist underlayer film formed and used for EUV exposure has a smaller thickness than a conventional film. In the formation of such a thin film, for example, pinhole or aggregation is likely to be caused due to the effects of the surface of a substrate and the polymer used and others, and thus it has been difficult to form a uniform film having no defect.

On the other hand, when forming a resist pattern, in the development step, a method is employed in which, using a solvent capable of dissolving the resist film, usually using an organic solvent, the unexposed portion of the resist film is removed so that the exposed portion of the resist film remains as a resist pattern. In such a negative development process, an improvement of the adhesion of the resist pattern is an important task.

Further, suppression of unfavorable LWR (line width roughness) when forming a resist pattern, formation of a resist pattern having an excellent rectangular form, and improvement of the resist sensitivity are desired. Moreover, a sublimate generated when baking the resist underlayer film causes problems of film formation failure and formation of a defective film.

An object of the present invention is to provide a composition which has solved the above-mentioned problems, and which is for use in forming a resist underlayer film that is capable of forming a desired resist pattern, and a method for forming a resist pattern using the resist underlayer film-forming composition.

Solution to Problem

The present invention encompasses the followings.

[1] An EUV resist underlayer film-forming composition comprising:

a compound represented by the following formula (1):

[Chemical formula 1]

Formula (1)

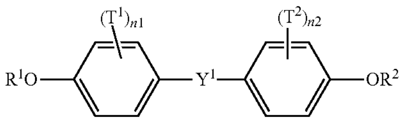

wherein:

$Y^1$ represents a single bond, an oxygen atom, a sulfur atom, an alkylene group having 1 to 10 carbon atoms and optionally being substituted with a halogen atom or an aryl group having 6 to 40 carbon atoms, or a sulfonyl group, $T^1$ and $T^2$ represent an alkyl group having 1 to 10 carbon atoms, $R^1$ and $R^2$ independently represent an alkyl group having 1 to 10 carbon atoms and being substituted with at least one hydroxy group, and n1 and n2 independently represent an integer of 0 to 4, a polymer, and an organic solvent.

[2] The EUV resist underlayer film-forming composition according to [1], wherein $Y^1$ is a sulfonyl group.

[3] The EUV resist underlayer film-forming composition according to [1] or [2], wherein the polymer comprises a heterocyclic structure.

[4] The EUV resist underlayer film-forming composition according to any one of [1] to [3], wherein the polymer has an end blocked.

[5] The EUV resist underlayer film-forming composition according to any one of [1] to [4], further comprising a crosslinking agent.

[6] The EUV resist underlayer film-forming composition according to any one of [1] to [5], further comprising a crosslinking catalyst.

[7] An EUV resist underlayer film which is a baked product of an applied film comprising the EUV resist underlayer film-forming composition according to any one of [1] to [6].

[8] A method for producing a patterned substrate, comprising the steps of:

applying the EUV resist underlayer film-forming composition according to any one of [1] to [6] onto a semiconductor substrate and baking the applied composition to form an EUV resist underlayer film;

applying an EUV resist onto the EUV resist underlayer film and baking the applied resist to form an EUV resist film;

irradiating the semiconductor substrate covered with the EUV resist underlayer film and the EUV resist with a light or an electron beam; and subjecting the exposed EUV resist film to development and patterning.

[9] A method for producing a semiconductor device, comprising the steps of:

forming an EUV resist underlayer film comprising the EUV resist underlayer film-forming composition according to any one of [1] to [6] on a semiconductor substrate;

forming an EUV resist film on the EUV resist underlayer film;

irradiating the EUV resist film with a light or an electron beam followed by development to form an EUV resist pattern;

subjecting the EUV resist underlayer film to etching through the formed EUV resist pattern to form a patterned EUV resist underlayer film; and processing the semiconductor substrate using the patterned EUV resist underlayer film.

Advantageous Effects of Invention

Attributable to the technical features defined above, the EUV resist underlayer film-forming composition of the present invention makes it possible to achieve improvement of the sensitivity and suppression of unfavorable LWR when forming a resist pattern. The EUV resist underlayer film-forming composition of the present invention also has an advantageous effect of reducing the sublimate generated during the formation (baking) of the resist underlayer film as compared with the prior art.

DESCRIPTION OF EMBODIMENTS

<EUV Resist Underlayer Film-Forming Composition>

The EUV resist underlayer film-forming composition of the present invention comprises a compound represented by the following formula (1):

[Chemical formula 2]

Formula (1)

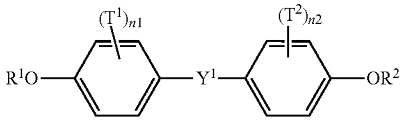

wherein:

$Y^1$ represents a single bond, an oxygen atom, a sulfur atom, an alkylene group having 1 to 10 carbon atoms and optionally being substituted with a halogen atom or an aryl group having 6 to 40 carbon atoms, or a sulfonyl group, $T^1$ and $T^2$ represent an alkyl group having 1 to 10 carbon atoms, $R^1$ and $R^2$ independently represent an alkyl group having 1 to 10 carbon atoms and being substituted with at least one hydroxy group, and n1 and n2 independently represent an integer of 0 to 4, polymer, and an organic solvent.

In the description of $R^1$ and $R^2$, the expression "being substituted with at least one hydroxy group" means that at least one hydrogen atom of the alkyl group having 1 to 10 carbon atoms is replaced by a hydroxy group. It is preferred that hydrogen atoms of the alkyl group are replaced by three hydroxy groups or less. It is preferred that hydrogen atoms of the alkyl group are replaced by two hydroxy groups or less. It is preferred that only one hydrogen atom of the alkyl group is replaced by a hydroxy group. It is preferred that, in each of $R^1$ and $R^2$, a hydrogen atom bonded to the terminal carbon of the compound is replaced by a hydroxy group.

Examples of the halogen atoms include a fluorine atom, a chlorine atom, a bromine atom, and an iodine atom.

Examples of the aryl groups having 6 to 40 carbon atoms include a phenyl group, an o-methylphenyl group, a m-methylphenyl group, a p-methylphenyl group, an o-chlorphenyl group, a m-chlorphenyl group, a p-chlorphenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the alkyl groups having 1 to 10 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n- propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, and a decyl group. Examples of the alkylene groups having 1 to 10 carbon atoms include divalent groups derived by removing one hydrogen atom from the alkyl group having 1 to 10 carbon atoms.

Specific examples of the compounds represented by formula (1) above include compounds having the structure shown below.

[Chemical formula 3]

(1b)

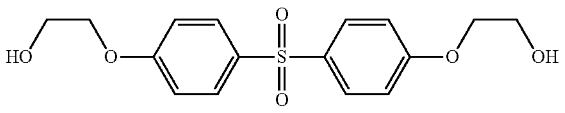

(1b-1)

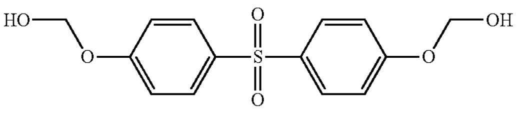

(1b-2)

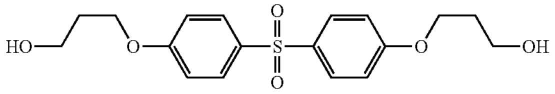

(1b-3)

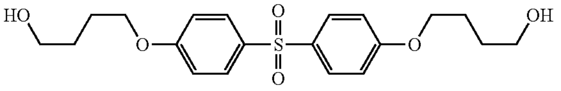

(1b-4)

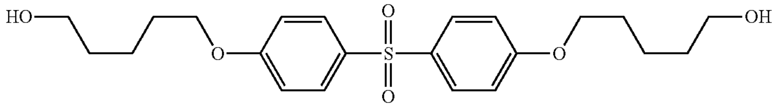

(1b-5)

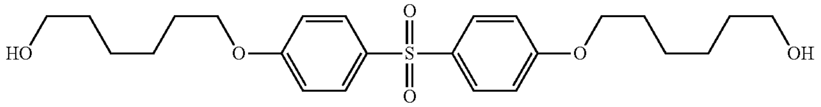

(1b-6)

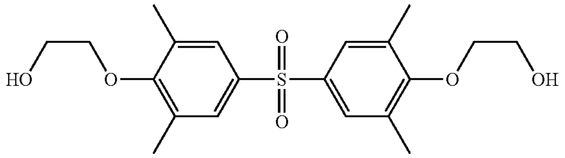

(1b-7)

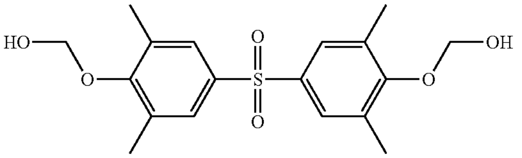

(1b-8)

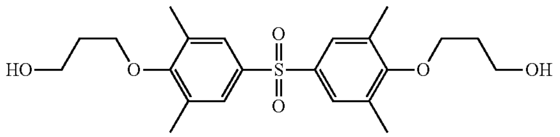

(1b-9)

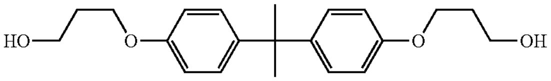

(1b-10)

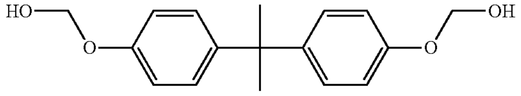

(1b-11)

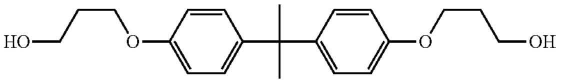

(1b-12)

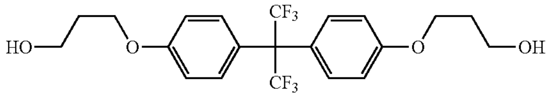

(1b-13)

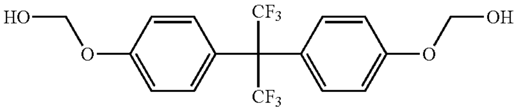

(1b-14)

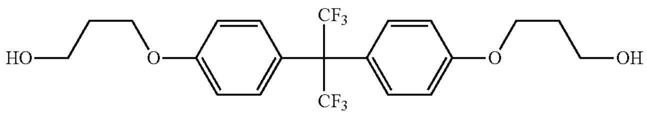

Of these, preferred is the compound of formula (1) above, wherein $Y^1$ is a sulfonyl group.

<Polymer>

With respect to the polymer used in the present invention, there is no particular limitation as long as an EUV resist underlayer film can be formed from the polymer, but the polymer preferably has a heterocyclic structure. Examples of the heterocycles include furan, thiophene, pyrrole, imidazole, pyran, pyridine, pyrimidine, pyrazine, pyrrolidine, piperidine, piperazine, morpholine, indole, purine, quinoline, isoquinoline, quinuclidine, chromene, thianthrene, phenothiazine, phenoxazine, xanthene, acridine, phenazine, carbazole, triazinone, triazinedione, and triazinetrione.

The heterocyclic structure is preferably a triazinone, triazinedione, or triazinetrione structure, and most preferably a triazinetrione structure.

Further, the polymer is preferably a reaction product of a compound containing two epoxy groups and at least one compound selected from a dicarboxylic acid-containing compound, an acid dianhydride, a compound containing two imino groups, and a compound having two hydroxy groups.

Examples of the compound containing two epoxy groups are shown in formula (a) to (h) and (v) to (x) below; and examples of the compound selected from a dicarboxylic acid-containing compound, an acid dianhydride, a compound containing two imino groups, and a compound having two hydroxy groups are shown in formula (i) to (k) and (l) to (u) below; however, the compounds are not limited to these examples. In formula (h), $R^0$ represents an alkylene group having 2 to 6 carbon atoms.

[Chemical formula 4]

(a)

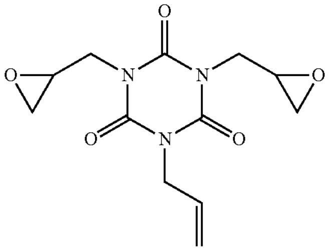

(b)

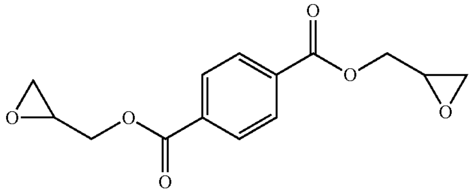

(c)

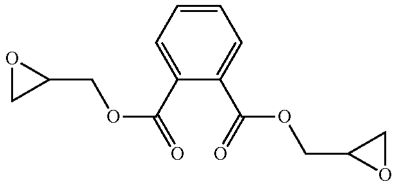

(d)

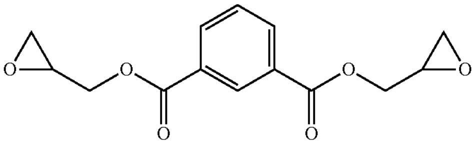

-continued (e)

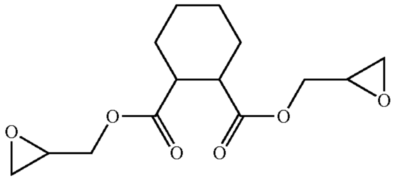

(f)

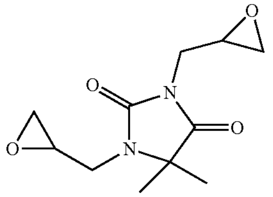

(g)

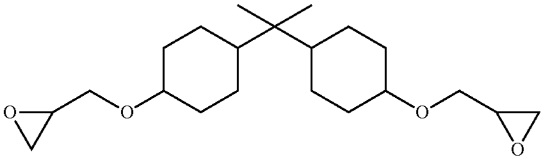

(h)

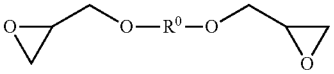

[Chemical formula 5]

(v)

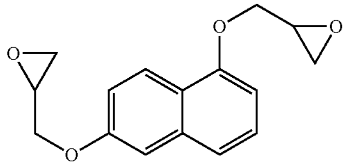

(w)

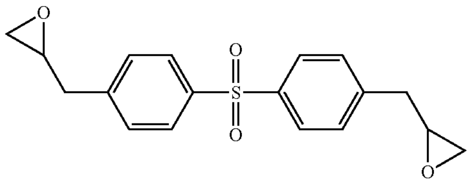

(x)

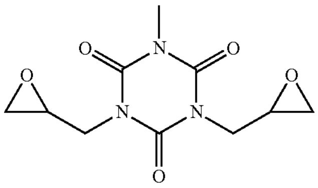

[Chemical formula 6]

(i)

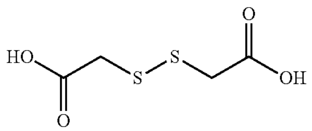

(j)

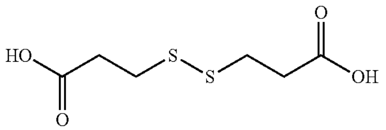

-continued
(k)
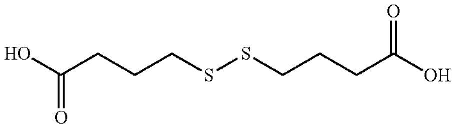
[Chemical formula 7]
(l)
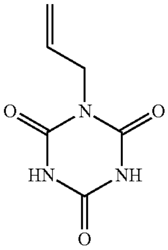
(m)
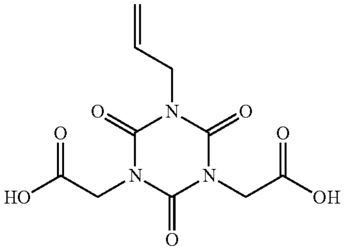
(n)
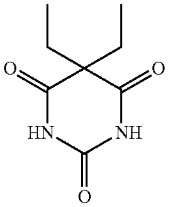
(o)
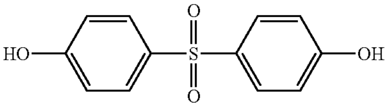
(p)
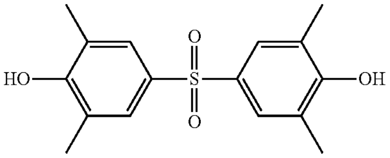
-continued
(q)
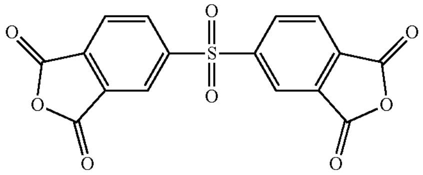
(r)
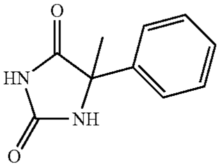
(s)
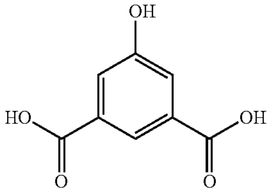
(t)
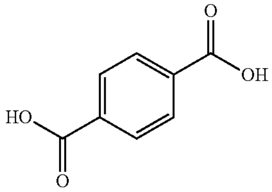
(u)
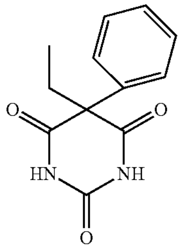
The polymer used in the present invention may be the below-shown polymer described in WO2009/096340 A1.
The polymer has a repeating unit structure represented by the following formula (11):
[Chemical formula 8]
(11)
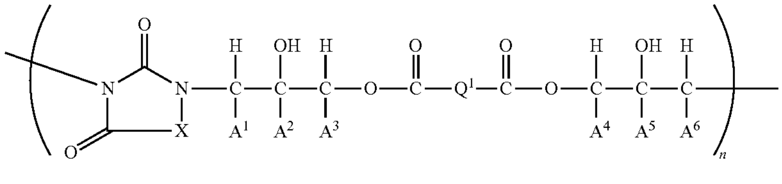

wherein X has a group represented by the following formula (12), (13), or (14):

[Chemical formula 9]

(12)

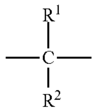

(13)

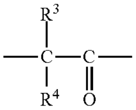

(14)

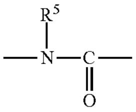

wherein, in formula (12), (13), and (14), each of $R^1$ to $R^5$ independently represents a hydrogen atom, an alkyl group having 1 to 6 carbon atoms, an alkenyl group having 3 to 6 carbon atoms, a benzyl group, or a phenyl group, wherein the phenyl group is optionally substituted with at least one group selected from the group consisting of an alkyl group having 1 to 6 carbon atoms, a halogen atom, an alkoxy group having 1 to 6 carbon atoms, a nitro group, a cyano group, and an alkylthio group having 1 to 6 carbon atoms, wherein $R^1$ and $R^2$, or $R^3$ and $R^4$ are optionally bonded together to form a ring having 3 to 6 carbon atoms, each of $A^1$ to $A^6$ independently represents a hydrogen atom, a methyl group, or an ethyl group, $Q^1$ represents a divalent group containing a disulfide bond, and n is the number of repeating unit structures and may be an integer of 5 to 100.

With respect to other information about this polymer, the corresponding disclosure of WO 2009/096340 is incorporated herein by reference.

The polymer used in the present invention may have the structural unit which is described in WO 2020/071361, and which is represented by the following formula (23):

[Chemical formula 10]

(23)

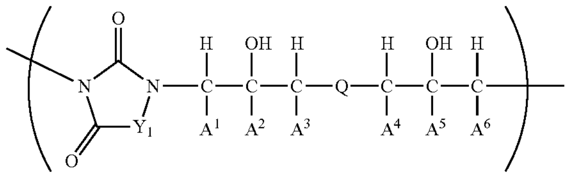

wherein each of $A_1$, $A_2$, $A_3$, $A_4$, $A_5$, and $A_6$ independently represents a hydrogen atom, a methyl group, or an ethyl group, $Y_1$ represents formula (24), (25), (26), or (27):

[Chemical formula 11]

(24)

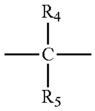

(25)

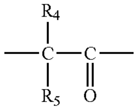

(26)

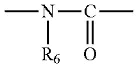

(27)

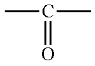

wherein, in formula (24) to (27), each of $R_4$ and $R_5$ independently represents a hydrogen atom, an alkyl group having 1 to 6 carbon atoms, an alkenyl group having 3 to 6 carbon atoms, a benzyl group, or a phenyl group, wherein the phenyl group is optionally substituted with at least one group selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms, wherein $R_4$ and $R_5$ are optionally bonded together to form a ring having 3 to 6 carbon atoms, and $R_6$ represents an alkyl group having 1 to 6 carbon atoms, an alkenyl group having 3 to 6 carbon atoms, a benzyl group, or a phenyl group, wherein the phenyl group is optionally substituted with at least one group selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms, and Q represents formula (28) or (29):

[Chemical formula 12]

(28)

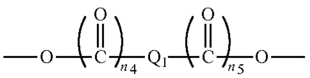

(29)

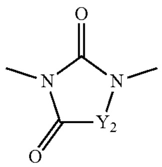

wherein, in formula (28) and (29), $Q_1$ represents an alkylene group having 1 to 10 carbon atoms, a phenylene group, a naphthylene group, or an anthrylene group, wherein each of the phenylene group, naphthylene group, and anthrylene group is optionally substituted with at least one group selected from the group consisting of an alkyl group having 1 to 6 carbon atoms, a halogen atom, an alkoxy group having 1 to 6 carbon atoms, a nitro group, a cyano group, a hydroxy group, and an alkylthio group having 1 to 6 carbon atoms, each of n4 and n5 independently represents a number of 0 or 1, and $Y_2$ represents formula (24), (25), or (27).

With respect to other information about this polymer, the corresponding disclosure of WO2020/071361 is incorporated herein by reference.

The polymer may have an end blocked by a compound containing an aliphatic ring that optionally has a carbon-carbon bond interrupted by a heteroatom and is optionally substituted with a substituent.

The aliphatic ring is preferably a monocyclic or polycyclic aliphatic ring having 3 to 10 carbon atoms. The polycyclic aliphatic ring is preferably a bicyclo ring or a tricyclo ring.

The aliphatic ring preferably has at least one unsaturated bond.

Specific examples of the carboxy group-containing compounds containing an aliphatic ring that optionally has a carbon-carbon bond interrupted by a heteroatom and is optionally substituted with a substituent include the compounds shown below.

[Chemical formula 13]

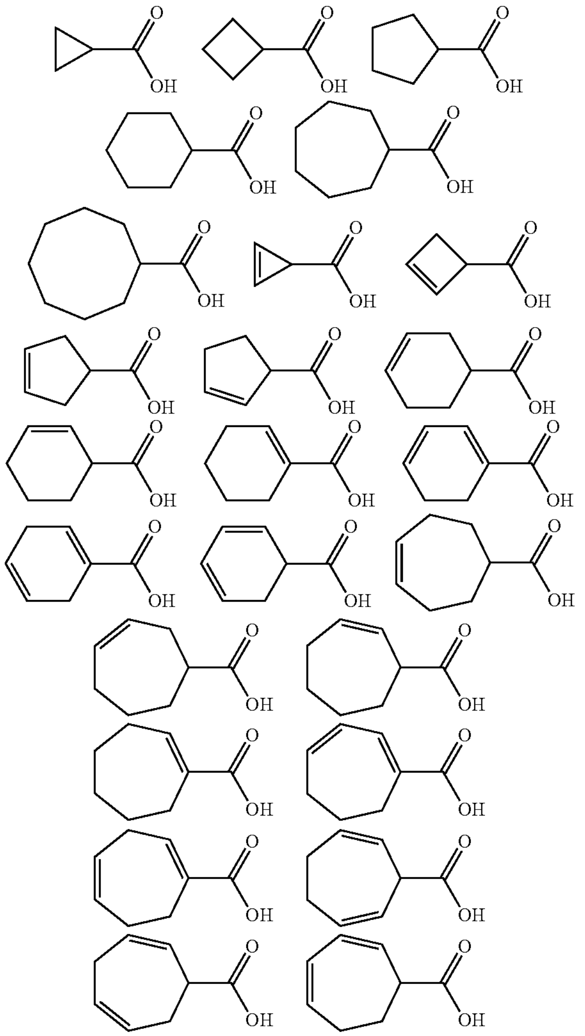

-continued

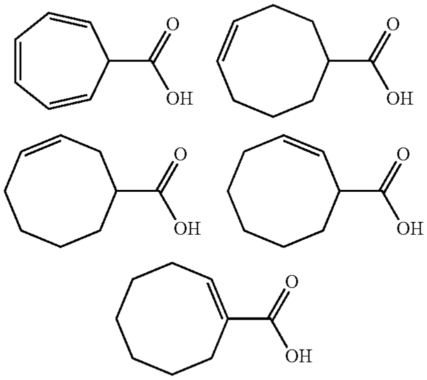

[Chemical formula 14]

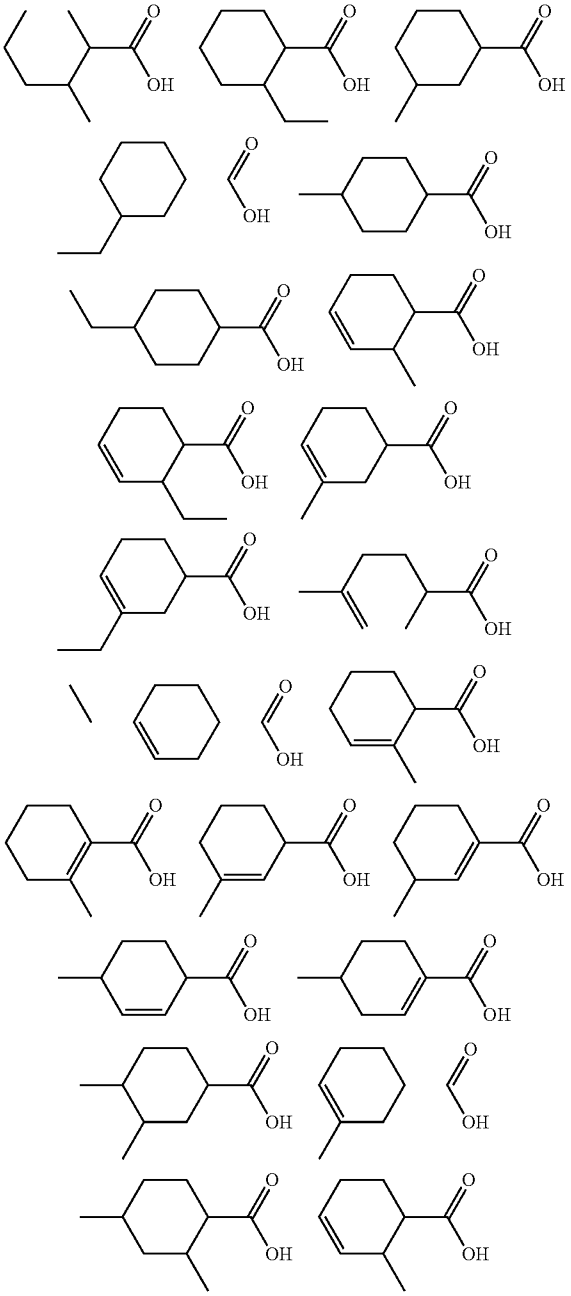

-continued

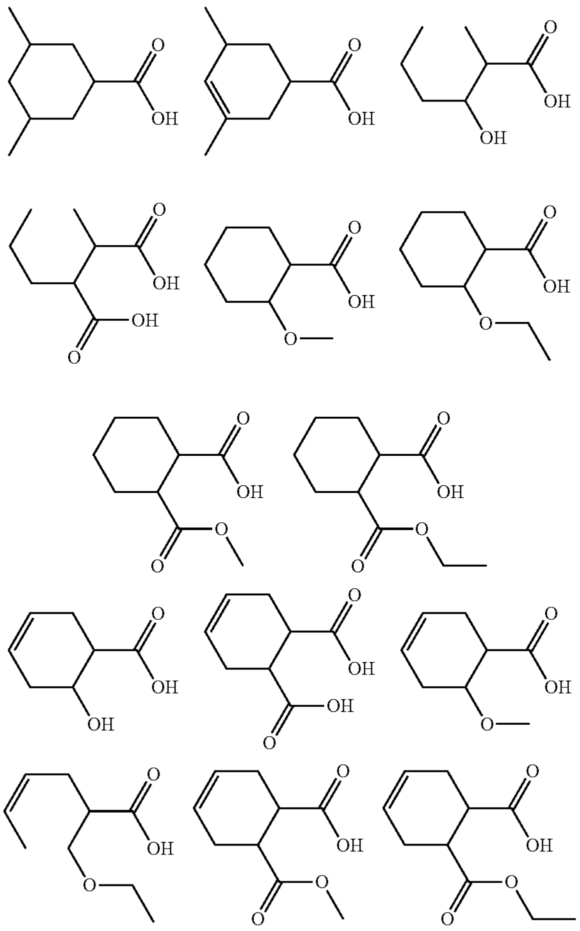

[Chemical formula 15]

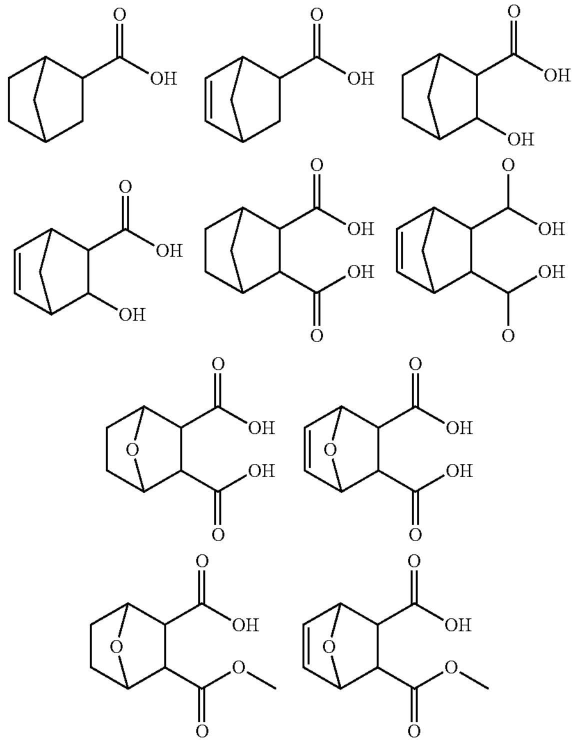

-continued

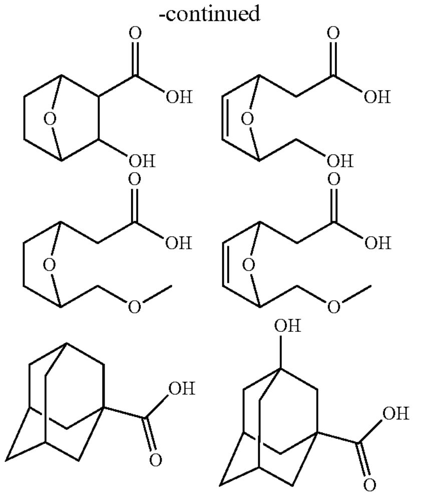

With regard to other details about the compound containing an aliphatic ring that optionally has a carbon-carbon bond interrupted by a heteroatom and is optionally substituted with a substituent, the corresponding disclosure of PCT/JP2020/018436 is incorporated herein by reference.

The polymer may be a polymer having at an end of the polymer chain a structure described in WO2020/071361 and represented by the following formula (31) or (32):

[Chemical formula 16]

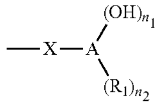

(31)

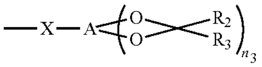

(32)

wherein, in formula (31) and (32), X is a divalent organic group, A is an aryl group having 6 to 40 carbon atoms, $R_1$ is a halogen atom, an alkyl group having 1 to 10 carbon atoms, or an alkoxy group having 1 to 10 carbon atoms, each of $R_2$ and $R_3$ is independently a hydrogen atom, a halogen atom, an alkyl group having 1 to 10 carbon atoms and optionally being substituted, or an aryl group having 6 to 40 carbon atoms and optionally being substituted, each of n1 and n3 is independently an integer of 1 to 12, and n2 is an integer of 0 to 11.

The compound having the partial structure represented by formula (31) above is, for example, represented by the following formula (1-1):

[Chemical formula 17]

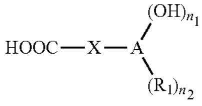

(1-1)

wherein X is a divalent organic group, A is an aryl group having 6 to 40 carbon atoms, $R_1$ is a halogen atom, an alkyl group having 1 to 40 carbon atoms, or an alkoxy group having 1 to 40 carbon atoms, n1 is an integer of 1 to 12, and n2 is an integer of 0 to 11.

Specific examples of the compounds represented by formula (1-1) above include the followings.

[Chemical formula 18]

Formula (A-1)

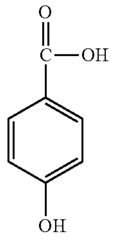

Formula (A-2)

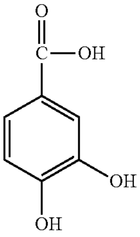

Formula (A-3)

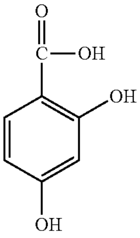

Formula (A-4)

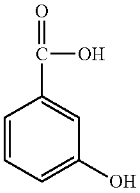

Formula (A-5)

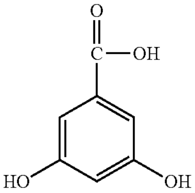

Formula (A-6)

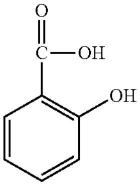

-continued

Formula (A-7)

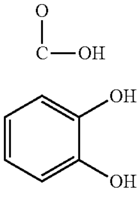

Formula (A-8)

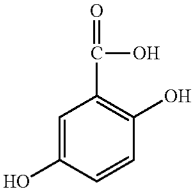

Formula (A-9)

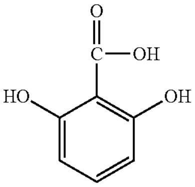

Formula (A-10)

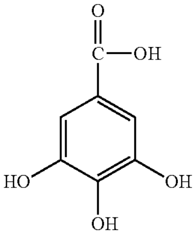

Formula (A-11)

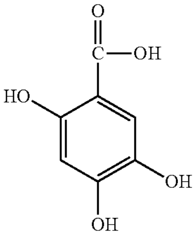

Formula (A-12)

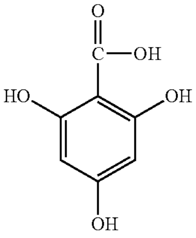

Formula (A-13)

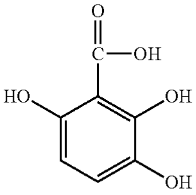

-continued
Formula (A-14)
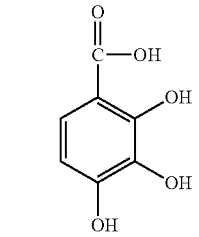
[Chemical formula 19]
Formula (A-15)
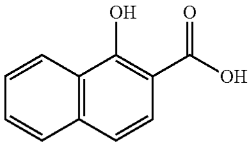
Formula (A-16)
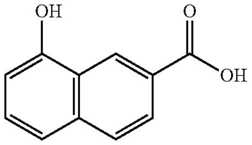
Formula (A-17)
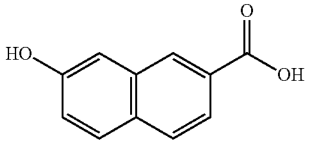
Formula (A-18)
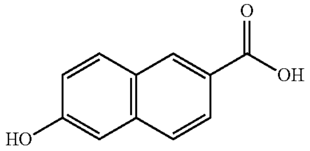
Formula (A-19)
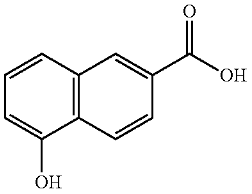
Formula (A-20)
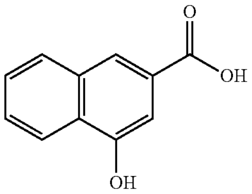
Formula (A-21)
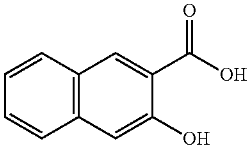
-continued
Formula (A-22)
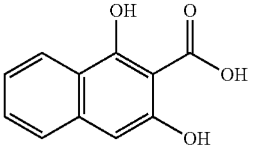
Formula (A-23)
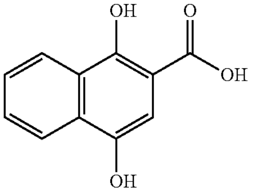
Formula (A-24)
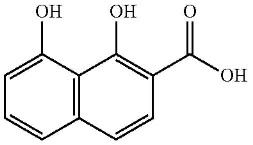
Formula (A-25)
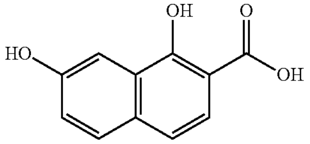
Formula (A-26)
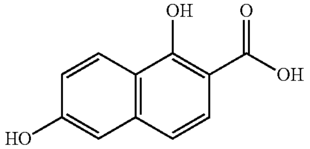
Formula (A-27)
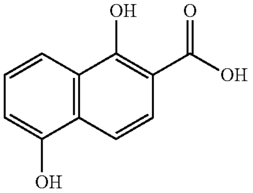
Formula (A-28)
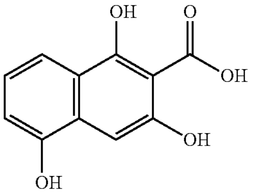
Formula (A-29)
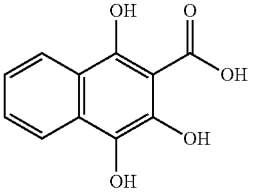

-continued
[Chemical formula 20]
Formula (A-30)
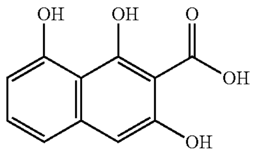
Formula (A-31)
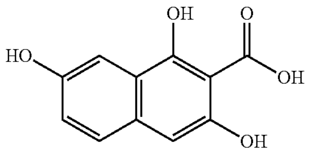
Formula (A-32)
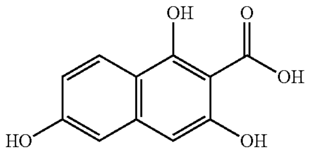
Formula (A-33)
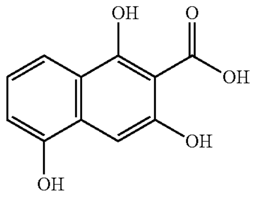
Formula (A-34)
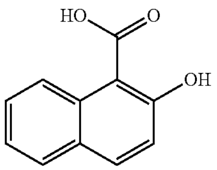
Formula (A-35)
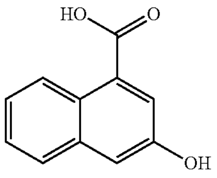
Formula (A-36)
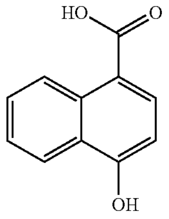
Formula (A-37)
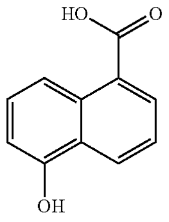
-continued
Formula (A-38)
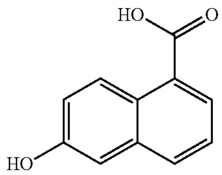
Formula (A-39)
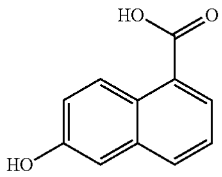
Formula (A-40)
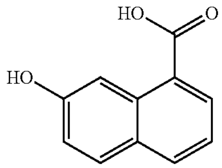
Formula (A-41)
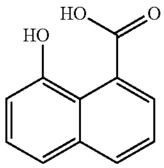
Formula (A-42)
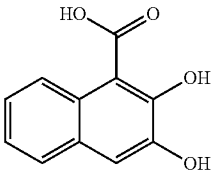
Formula (A-43)
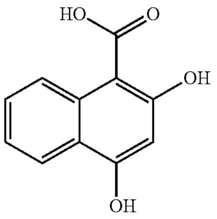
Formula (A-44)
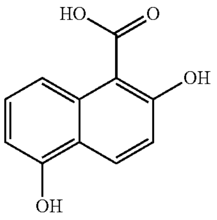
[Chemical formula 21]
Formula (A-45)
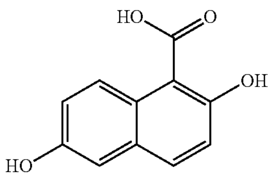

-continued
Formula (A-46)
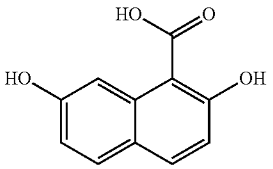
Formula (A-47)
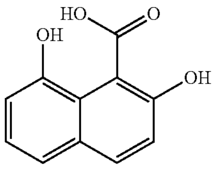
Formula (A-48)
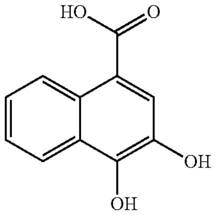
Formula (A-49)
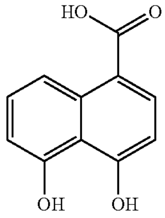
Formula (A-50)
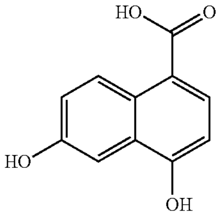
Formula (A-51)
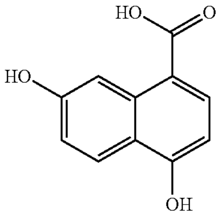
Formula (A-52)
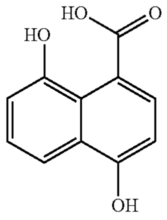
-continued
Formula (A-53)
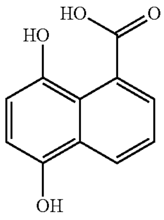
Formula (A-54)
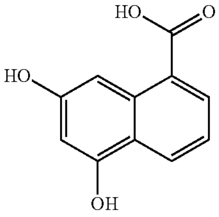
Formula (A-55)
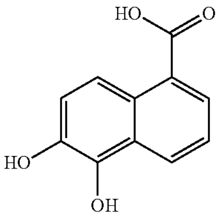
Formula (A-56)
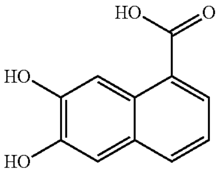
Formula (A-57)
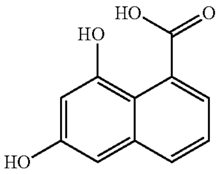
Formula (A-58)
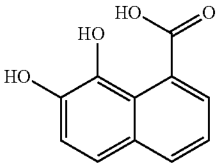
Formula (A-59)
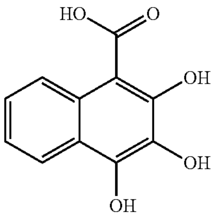

-continued
Formula (A-60)
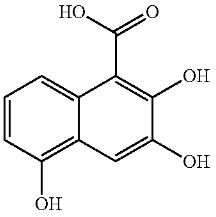
Formula (A-61)
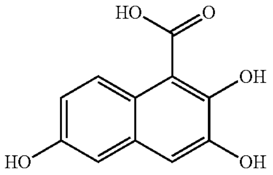
Formula (A-62)
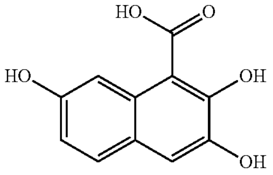
Formula (A-63)
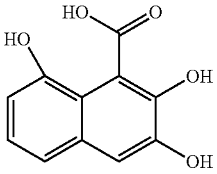
[Chemical formula 22]
Formula (A-78)
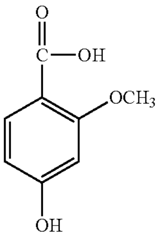
Formula (A-79)
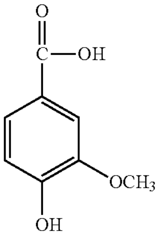
Formula (A-80)
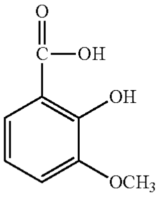
-continued
Formula (A-81)
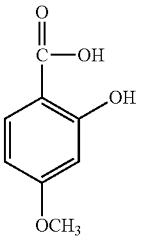
Formula (A-82)
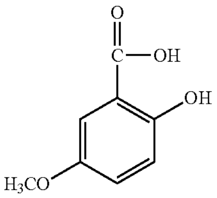
Formula (A-83)
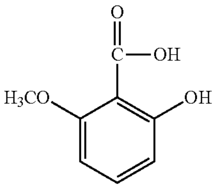
Formula (A-84)
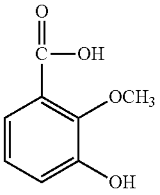
Formula (A-85)
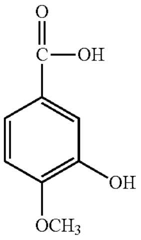
Formula (A-86)
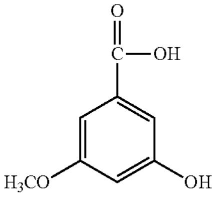
Formula (A-87)
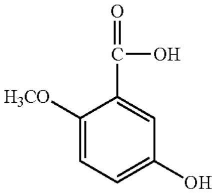

-continued
Formula (A-88)
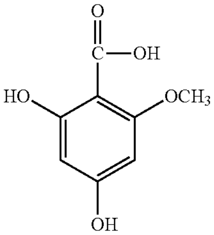
Formula (A-89)
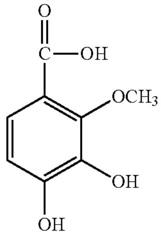
Formula (A-90)
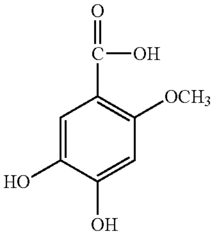
[Chemical formula 23]
Formula (A-91)
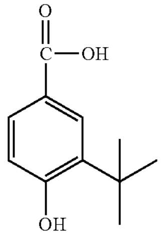
Formula (A-92)
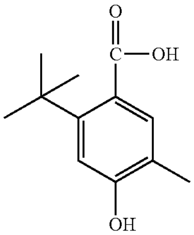
Formula (A-93)
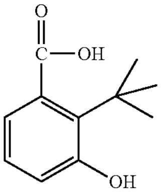
-continued
Formula (A-94)
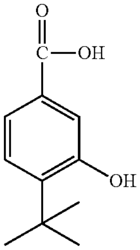
Formula (A-95)
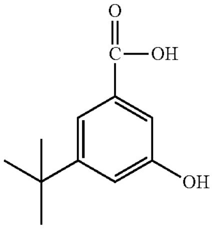
Formula (A-96)
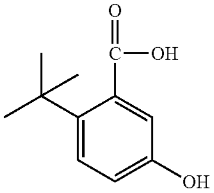
Formula (A-97)
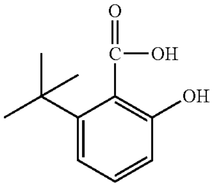
Formula (A-98)
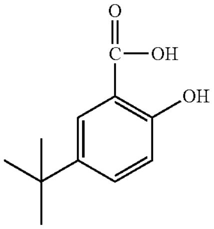
Formula (A-99)
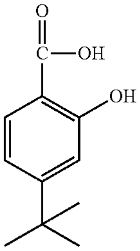
Formula (A-100)
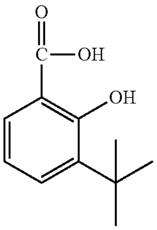

-continued

Formula (A-101)

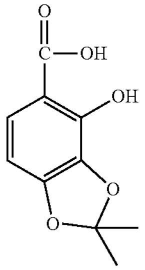

Formula (A-102)

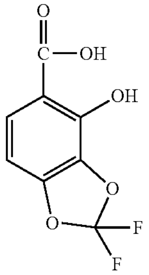

The compound having the partial structure represented by formula (32) above is, for example, represented by the following formula (2-1):

[Chemical formula 24]

(2-1)

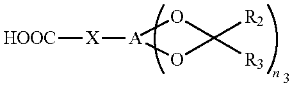

wherein X is a divalent organic group, A is an aryl group having 6 to 40 carbon atoms, each of $R_2$ and $R_3$ is independently a hydrogen atom, an alkyl group having 1 to 10 carbon atoms and optionally being substituted, an aryl group having 6 to 40 carbon atoms and optionally being substituted, or a halogen atom, and n3 is an integer of 1 to 12.

Specific examples of the compounds represented by formula (2-1) above include the followings.

[Chemical formula 25]

Formula (A-64)

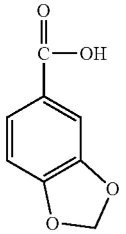

Formula (A-65)

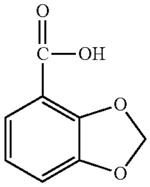

-continued

Formula (A-66)

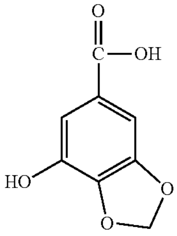

Formula (A-67)

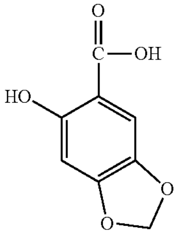

Formula (A-69)

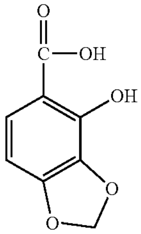

Formula (A-69)

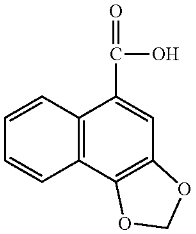

Formula (A-70)

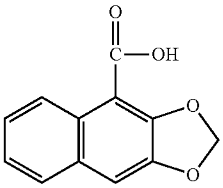

Formula (A-71)

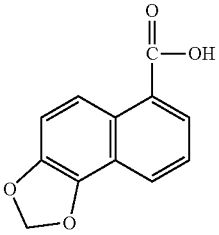

Formula (A-72)

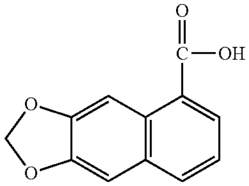

-continued

Formula (A-73)

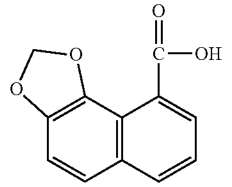

Formula (A-74)

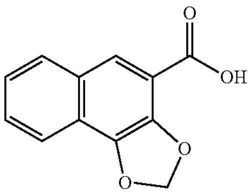

Formula (A-75)

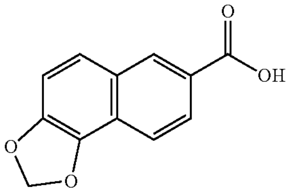

Formula (A-76)

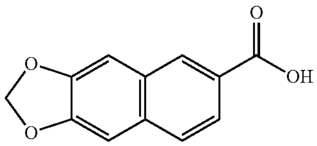

Formula (A-77)

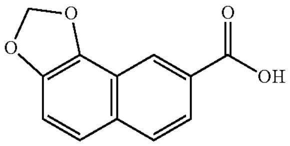

With respect to other information about the present terminal structure, the corresponding disclosure of WO2020/071361 is incorporated herein by reference.

The end of the polymer may be represented by the following formula (41) or (42):

[Chemical formula 26]

(41)

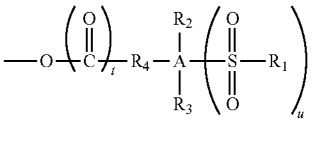

(42)

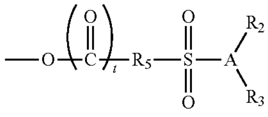

wherein, in formula (41) and (42), $R_1$ represents an alkyl group having 1 to 6 carbon atoms and optionally having a substituent, a phenyl group, a pyridyl group, a halogeno group, or a hydroxy group, $R_2$ represents a hydrogen atom, an alkyl group having 1 to 6 carbon atoms, a hydroxy group, a halogeno group, or an ester group represented by —C(═O)O—X wherein X represents an alkyl group having 1 to 6 carbon atoms and optionally having a substituent, $R_3$ represents a hydrogen atom, an alkyl group having 1 to 6 carbon atoms, a hydroxy group, or a halogeno group, $R_4$ represents a direct bond or a divalent organic group having 1 to 8 carbon atoms, $R_5$ represents a divalent organic group having 1 to 8 carbon atoms, A represents an aromatic ring or an aromatic heterocycle, t represents 0 or 1, and u represents 1 or 2.

With respect to the detailed information about the description of formula (41) and (42) above, the corresponding disclosure of WO2015/163195 is incorporated herein by reference.

The terminal structure of the reaction product of compound (A) and compound (B), which is represented by formula (41) or (42) above, may be produced by reacting the above-mentioned polymer and a compound represented by the following formula (41a) and/or a compound represented by the following formula (42a):

[Chemical formula 27]

(41a)

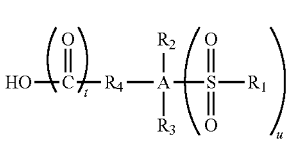

(42a)

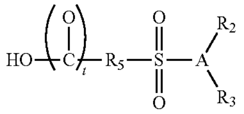

wherein the meanings of the characters and numerals in formula (41a) and (42a) are as defined above for formula (41) and (42).

Examples of the compound represented by formula (41a) include the compounds represented by the following formulae.

[Chemical formula 28]

(1a-1)

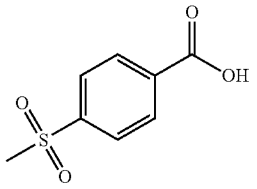

(1a-2)

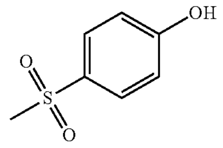

(1a-3)

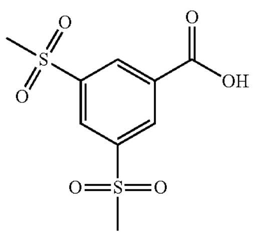

-continued
(1a-4)
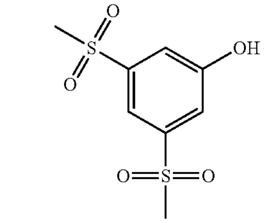
(1a-5)
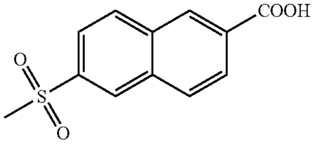
(1a-6)
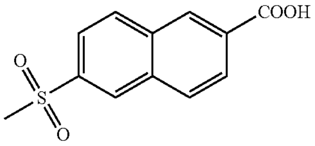
(1a-7)
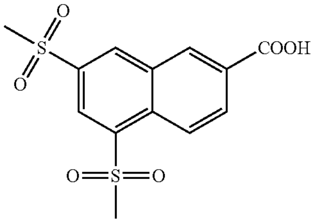
(1a-8)
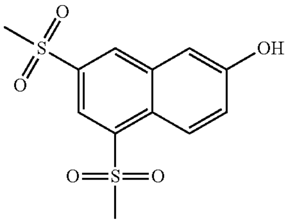
(1a-9)
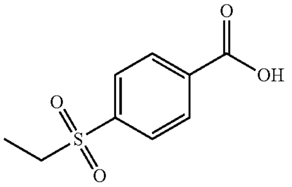
(1a-10)
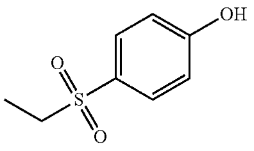
(1a-11)
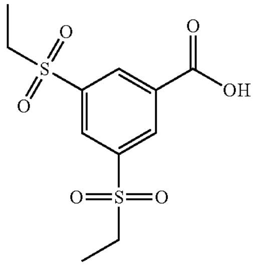
-continued
(1a-12)
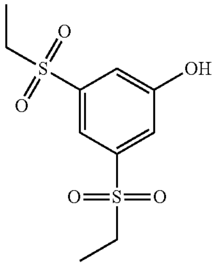
(1a-13)
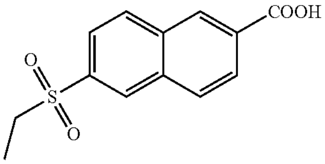
(1a-14)
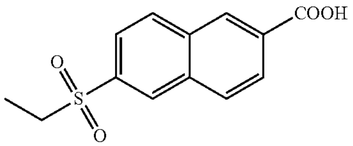
(1a-15)
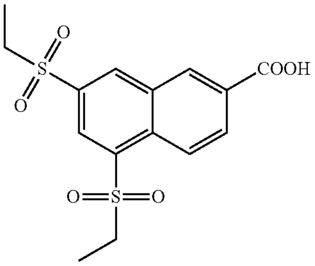
(1a-16)
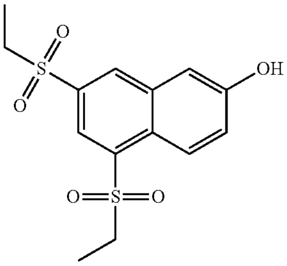
(1a-17)
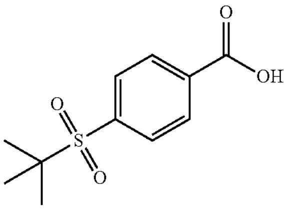
(1a-18)
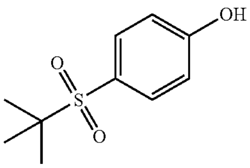

-continued
(1a-19)
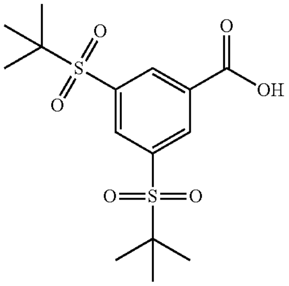
(1a-20)
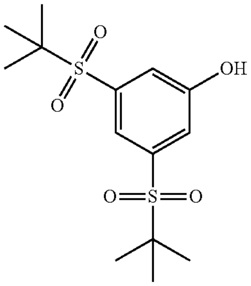
[Chemical formula 29]
(1a-21)
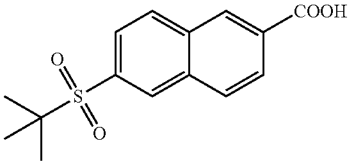
(1a-22)
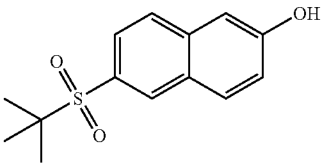
(1a-23)
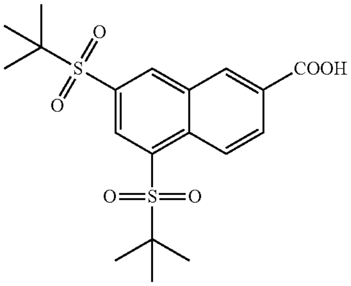
(1a-24)
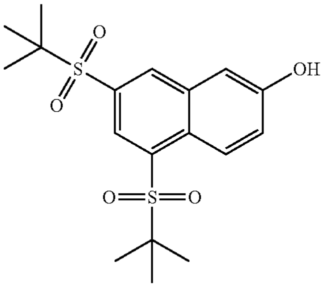
-continued
(1a-25)
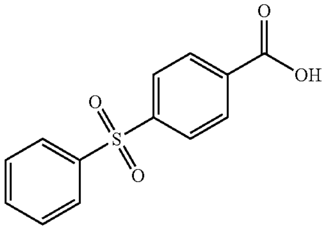
(1a-26)
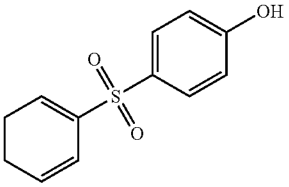
(1a-27)
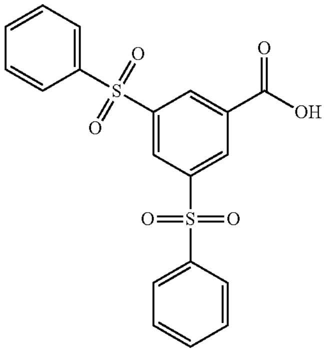
(1a-28)
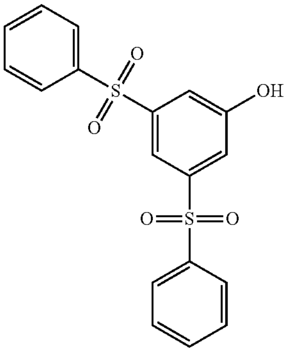
(1a-29)
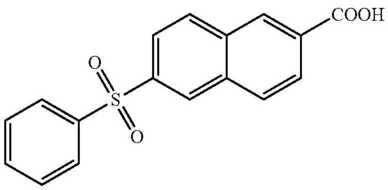
(1a-30)
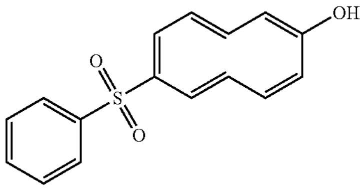

-continued
(1a-31)
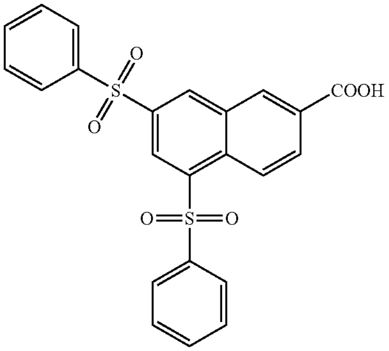
(1a-32)
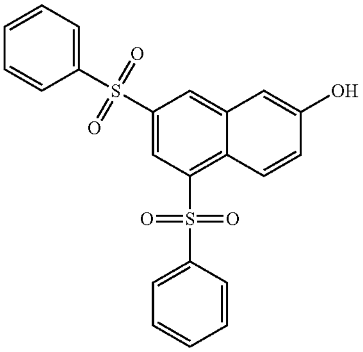
[Chemical formula 30]
(1a-33)
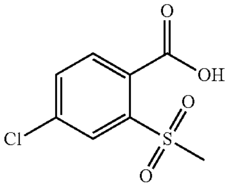
(1a-34)
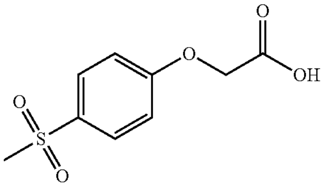
(1a-35)
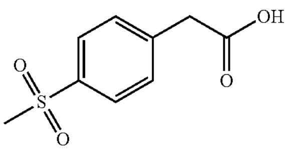
(1a-36)
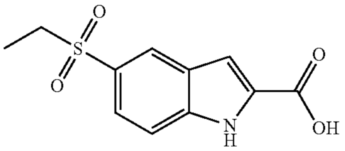
-continued
(1a-37)
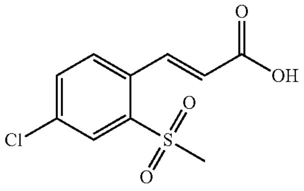
(1a-38)
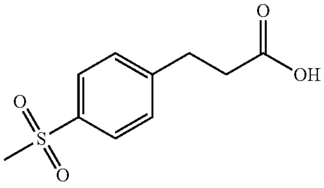
(1a-39)
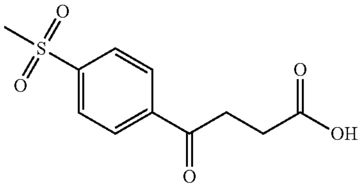
(1a-40)
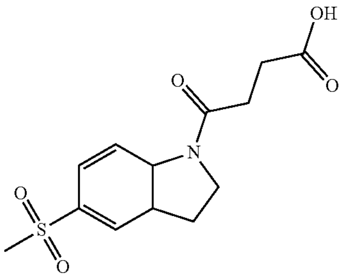
(1a-41)
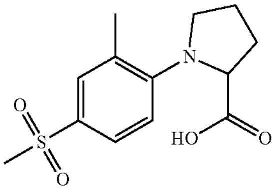
(1a-42)
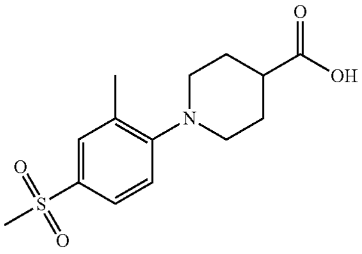
(1a-43)
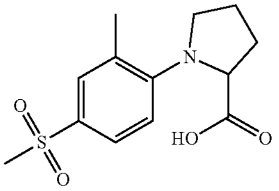

-continued
(1a-44)
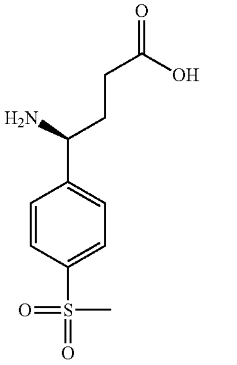
(1a-45)
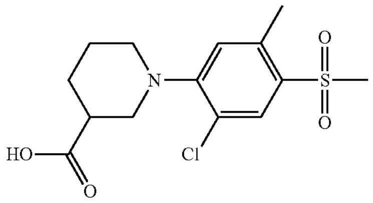
(1a-46)
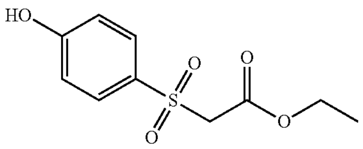
[Chemical formula 31]
(1a-47)
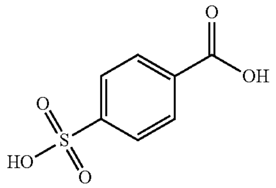
(1a-48)
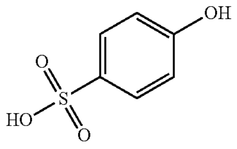
(1a-49)
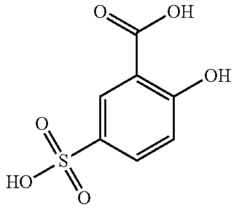
(1a-50)
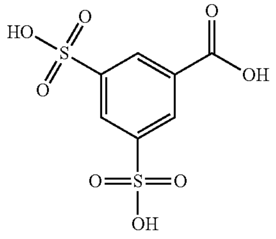
-continued
(1a-51)
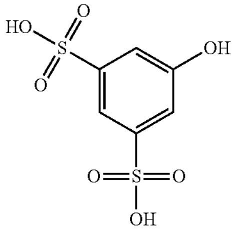
(1a-52)
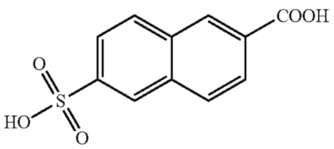
(1a-53)
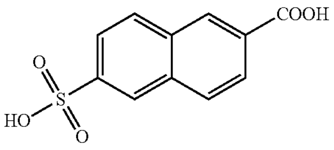
(1a-54)
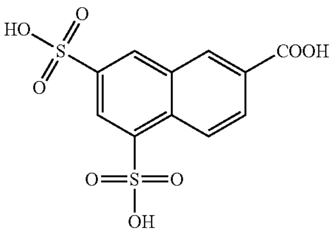
(1a-55)
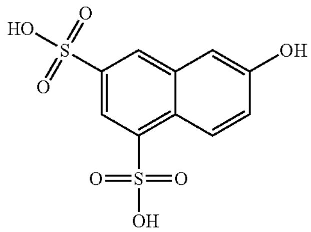
(1a-56)
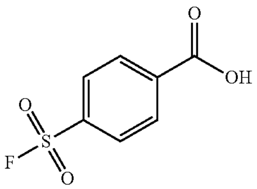
(1a-57)
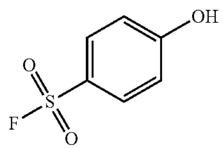
(1a-58)
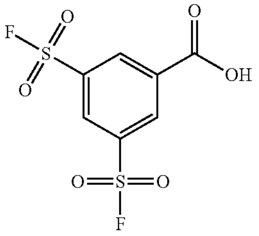

-continued
(1a-59)
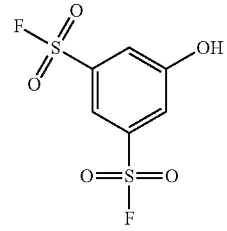
(1a-60)
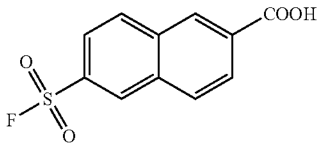
(1a-61)
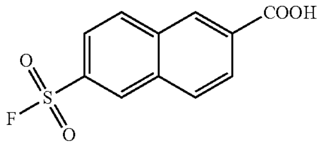
(1a-62)
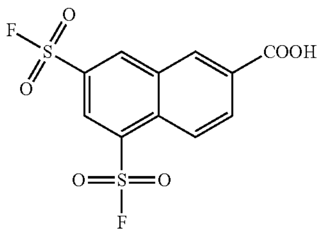
(1a-63)
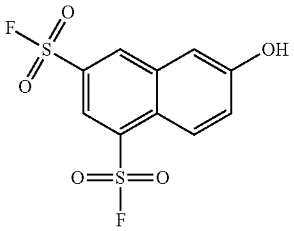
(1a-64)
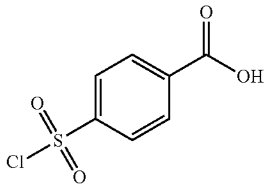
(1a-65)
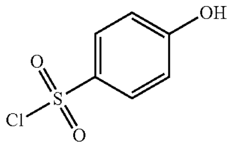
(1a-66)
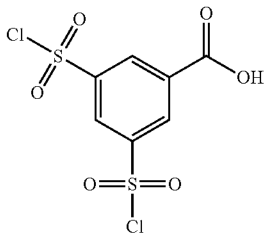
-continued
(1a-67)
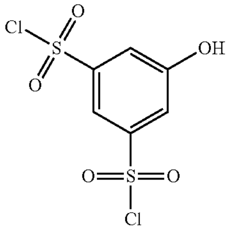
(1a-68)
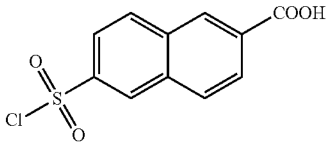
(1a-69)
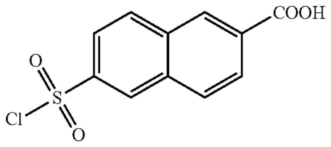
(1a-70)
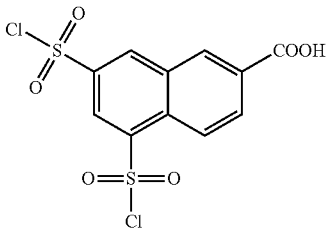
(1a-71)
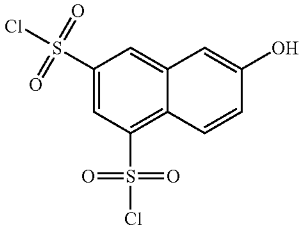
[Chemical formula 32]
(1a-72)
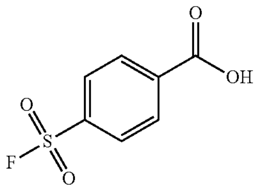
(1a-73)
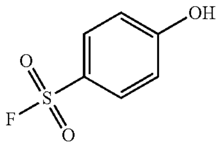

-continued
(1a-74)
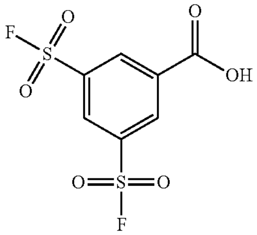
(1a-75)
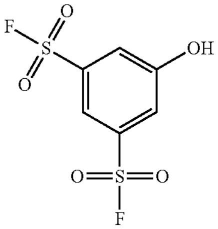
(1a-76)
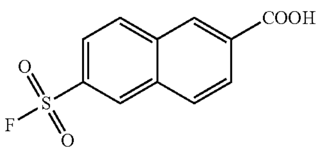
(1a-77)
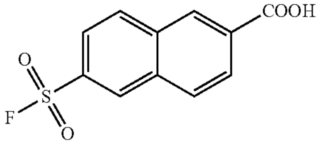
(1a-78)
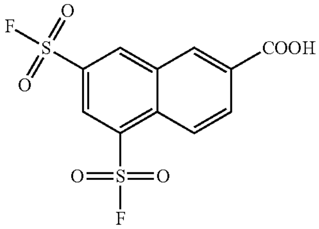
(1a-79)
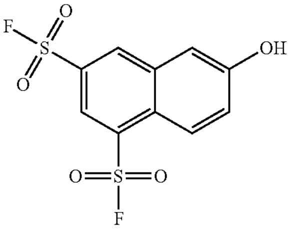
(1a-80)
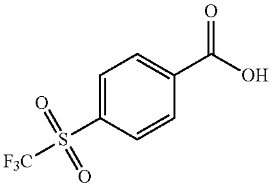
(1a-81)
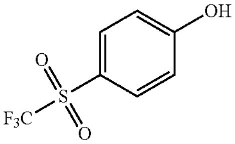
-continued
(1a-82)
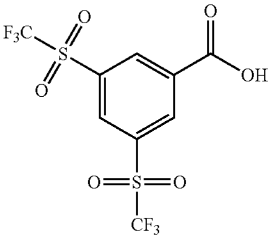
(1a-83)
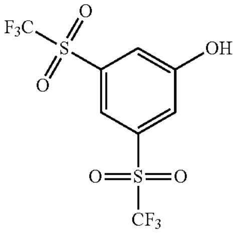
(1a-84)
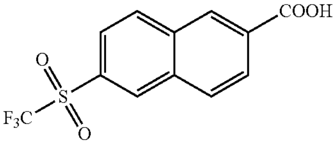
(1a-85)
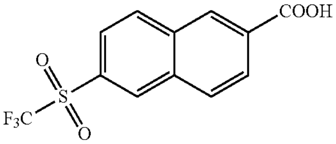
(1a-86)
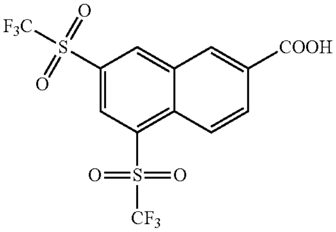
(1a-87)
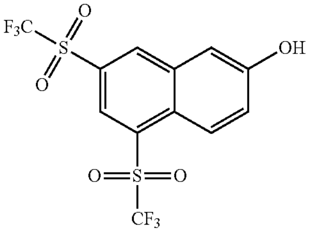
Examples of the compound represented by formula (42a) include the compounds represented by the following formulae.

[Chemical formula 33]

(2a-1)

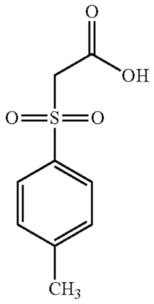

(2a-2)

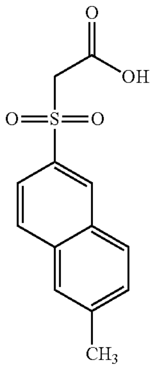

(2a-3)

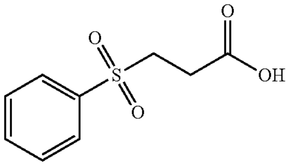

(2a-4)

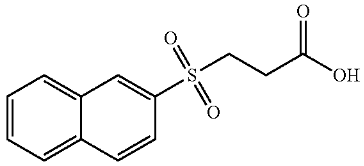

(2a-5)

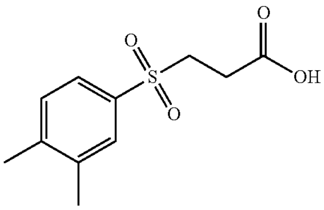

(2a-6)

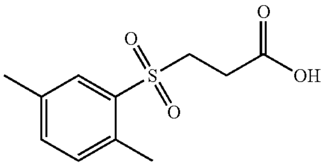

-continued (2a-7)

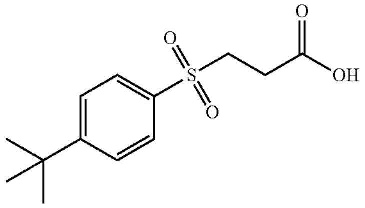

(2a-8)

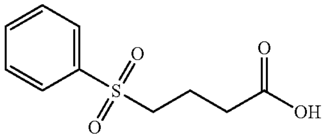

(2a-9)

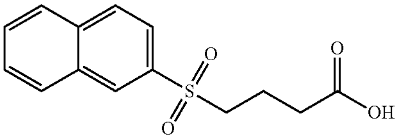

(2a-10)

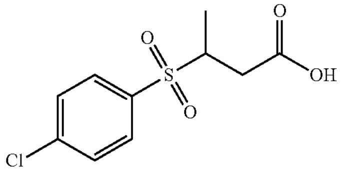

(2a-11)

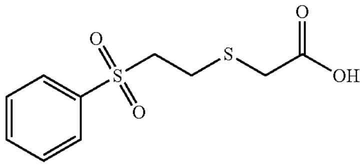

(2a-12)

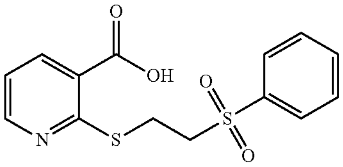

(2a-13)

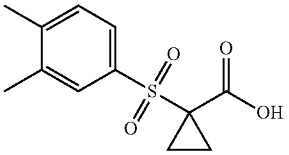

<Organic Solvent>

Examples of the organic solvent contained in the EUV resist underlayer film-forming composition of the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof.

Of these solvents, for example, propylene glycol monomethyl ether, propylene glycol monomethyl ether acetate, ethyl lactate, butyl lactate, and cyclohexanone are preferred. Especially preferred are propylene glycol monomethyl ether and propylene glycol monomethyl ether acetate.

<Crosslinking Agent>

Examples of the crosslinking agent contained as an optional component in the EUV resist underlayer film-forming composition of the present invention include hexamethoxymethylmelamine, tetramethoxymethylbenzoguanamine, 1,3,4,6-tetrakis(methoxymethyl)glycoluril (tetramethoxymethylglycoluril) (POWDERLINK [registered trademark] 1174), 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

Further, the crosslinking agent in the present invention may be a nitrogen-containing compound having per molecule 2 to 6 substituents bonded to a nitrogen atom, which is described in WO2017/187969 and represented by the following formula (51):

[Chemical formula 34]

(51)

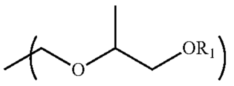

wherein $R_1$ represents a methyl group or an ethyl group.

The nitrogen-containing compound having 2 to 6 substituents represented by formula (51) above per molecule may be a glycoluril derivative represented by the following formula (1A):

[Chemical formula 35]

(1A)

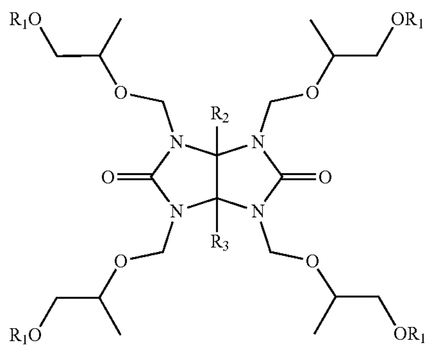

wherein each of four $R_1$'s independently represents a methyl group or an ethyl group, and each of $R_2$ and $R_3$ independently represents a hydrogen atom, an alkyl group having 1 to 4 carbon atoms, or a phenyl group.

Examples of the glycoluril derivative represented by formula (1A) include the compounds represented by the following formulae (1A-1) to (1A-6).

[Chemical formula 36]

(1A-1)

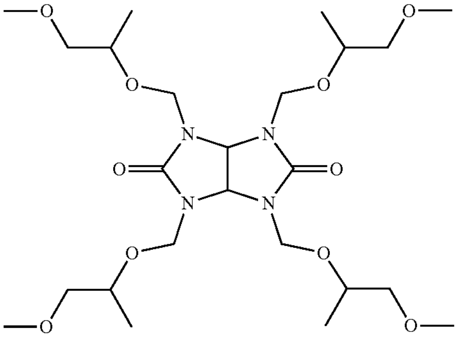

(1A-2)

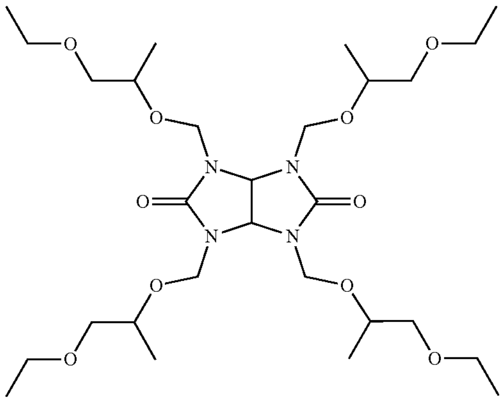

(1A-3)

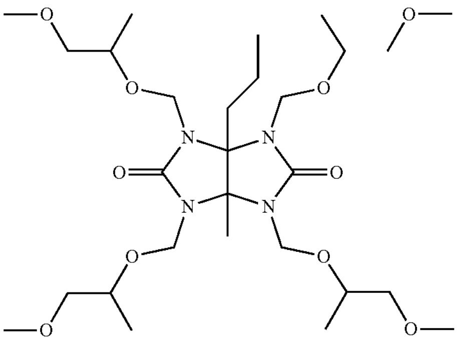

(1A-4)

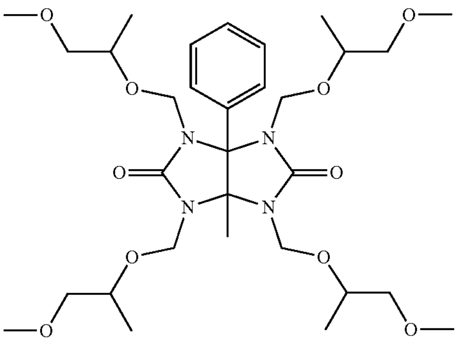

-continued (1A-5)

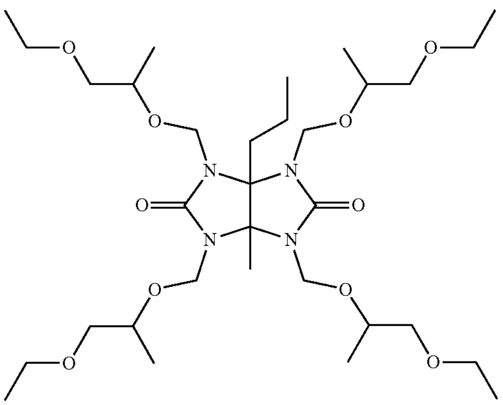

(1A-6)

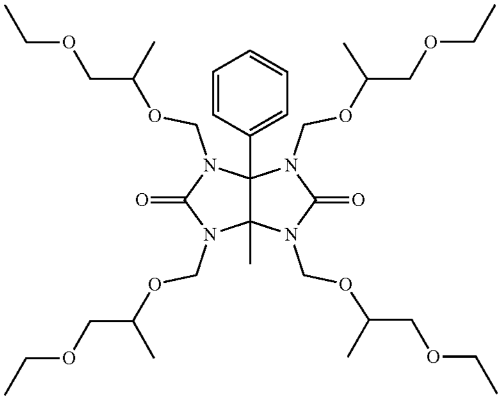

The compound represented by formula (1A) may be obtained by allowing a nitrogen-containing compound having per molecule 2 to 6 substituents bonded to a nitrogen atom and represented by the following formula (52) to react with at least one compound represented by the following formula (53), to produce a nitrogen-containing compound having per molecule 2 to 6 substituents represented by formula (51) above:

[Chemical formula 37]

(52)

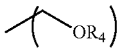

(53)

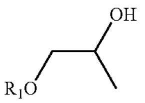

wherein, in formula (52) and (53), $R_1$ represents a methyl group or an ethyl group, and $R_4$ represents an alkyl group having 1 to 4 carbon atoms.

The glycoluril derivative represented by formula (1A) may be obtained by reacting a glycoluril derivative represented by formula (2A) below and at least one compound represented by formula (53) above.

The nitrogen-containing compound having 2 to 6 substituents represented by formula (52) above per molecule is, for example, a glycoluril derivative represented by the following formula (2A):

[Chemical formula 38]

(2A)

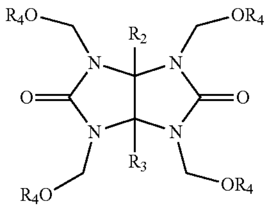

wherein each of $R_2$ and $R_3$ independently represents a hydrogen atom, an alkyl group having 1 to 4 carbon atoms, or a phenyl group, and each $R_4$ independently represents an alkyl group having 1 to 4 carbon atoms.

Examples of the glycoluril derivative represented by formula (2A) include the compounds represented by the following formulae (2A-1) to (2A-4). Further, examples of the compound represented by formula (53) include the compounds represented by the following formulae (3-1) and (3-2).

[Chemical formula 39]

(2A-1)

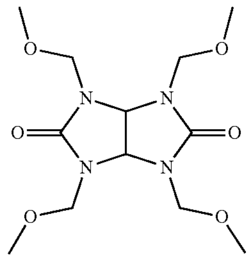

(2A-2)

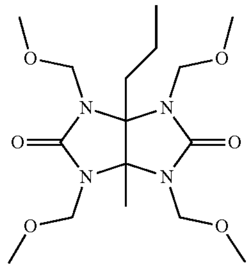

(2A-3)

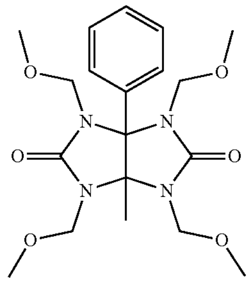

-continued (2A-4)

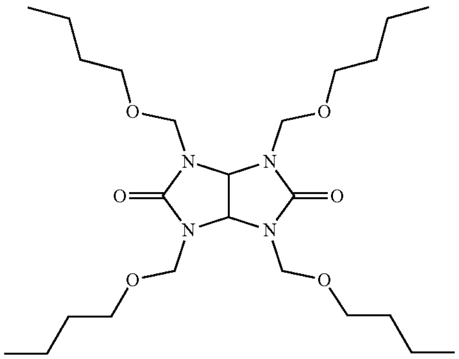

[Chemical formula 40]

(3-1)

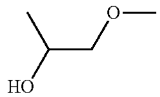

(3-2)

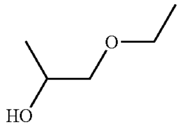

With regard to other details about the nitrogen-containing compound having per molecule 2 to 6 substituents bonded to a nitrogen atom and represented by formula (51), the corresponding disclosure of WO2017/187969 is incorporated herein by reference.

When the crosslinking agent is used, the amount of the crosslinking agent contained is, for example, within the range of 1 to 50% by mass, preferably 5 to 30% by mass, based on the mass of the polymer.

<Crosslinking Catalyst (Curing Catalyst)>

Examples of the crosslinking catalyst (curing catalyst) contained as an optional component in the EUV resist underlayer film-forming composition of the present invention include sulfonic acid compounds and carboxylic acid compounds, such as p-toluenesulfonic acid, trifluoromethanesulfonic acid, pyridinium p-toluenesulfonate, pyridinium p-hydroxybenzenesulfonate (pyridinium p-phenolsulfonate), pyridinium trifluoromethanesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid.

When the crosslinking catalyst is used, the amount of the crosslinking catalyst contained is, for example, within the range of 0.1 to 50% by mass, preferably 1 to 30% by mass, based on the mass of the crosslinking agent.

<Other Components>

In the resist underlayer film-forming composition of the present invention, for further improving the application properties to prevent the occurrence of pinhole or striation and uneven surface, a surfactant may be further incorporated into the composition. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkyl aryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP EF301, EF303, EF352 (trade name, manufactured by Tohchem Products Co., Ltd.), MEGAFACE F171, F173, R-30 (trade name, manufactured by DIC Corporation), Fluorad FC430, FC431 (trade name, manufactured by Sumitomo 3M), AsahiGuard AG710, Surflon S-382, SC101, SC102, SC103, SC104, SC105, SC106 (trade name, manufactured by AGC Inc.), and organosiloxane polymer KP341 (manufactured by Shin-Etsu Chemical Co., Ltd.). The amount of the surfactant incorporated is generally 2.0% by mass or less, preferably 1.0% by mass or less, based on the total mass of the solids in the resist underlayer film-forming composition of the present invention. These surfactants may be used each alone or in combination of two or more thereof.

<EUV Resist Underlayer Film>

The EUV resist underlayer film of the present invention may be produced by applying the above-described EUV resist underlayer film-forming composition onto a semiconductor substrate and baking the applied composition.

Examples of semiconductor substrates to which the resist underlayer film-forming composition of the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on the surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a BPSG (Boro-Phospho Silicate Glass) film, a titanium nitride film, a titanium nitride oxide film, a tungsten film, a gallium nitride film, and a gallium arsenide film.

The resist underlayer film-forming composition of the present invention is applied onto the above-mentioned semiconductor substrate by an appropriate application method, such as a spinner or a coater. Then, the applied composition is baked using a heating means, such as a hotplate, to form a resist underlayer film. Conditions for baking are appropriately selected from those at a baking temperature of 100 to 400° C. for a baking time of 0.3 to 60 minutes. Preferred conditions for baking are those at a baking temperature of 120 to 350° C. for a baking time of 0.5 to 30 minutes, and more preferred conditions are those at a baking temperature of 150 to 300° C. for a baking time of 0.8 to 10 minutes.

The thickness of the formed EUV resist underlayer film is, for example, within the range of 0.001 μm (1 nm) to 10 μm, 0.002 μm (2 nm) to 1 μm, 0.005 μm (5 nm) to 0.5 μm (500 nm), 0.001 μm (1 nm) to 0.05 μm (50 nm), 0.002 μm (2 nm) to 0.05 μm (50 nm), 0.003 μm (1 nm) to 0.05 μm (50 nm), 0.004 μm (4 nm) to 0.05 μm (50 nm), 0.005 μm (5 nm) to 0.05 μm (50 nm), 0.003 μm (3 nm) to 0.03 μm (30 nm), 0.003 μm (3 nm) to 0.02 μm (20 nm), or 0.005 μm (5 nm) to 0.02 μm (20 nm). When the temperature for baking is lower than the above-mentioned range, crosslinking becomes unsatisfactory. To the contrary, when the temperature for baking is higher than the above-mentioned range, the resist underlayer film is likely to be decomposed due to heat.

<Method for Producing a Patterned Substrate and Method for Producing a Semiconductor Device>

The method for producing a patterned substrate comprises the steps described below. Generally, a patterned substrate is produced by forming a photoresist layer on an EUV resist underlayer film. With respect to the photoresist formed on the EUV resist underlayer film by applying and baking by a known method, there is no particular limitation as long as it is sensitive to a light used in the exposure. Any of a negative photoresist and a positive photoresist can be used. They include, for example, a positive photoresist comprising a novolak resin and 1,2-naphthoquinonediazidosulfonate; a chemical amplification photoresist comprising a binder having a group which is decomposed due to an acid to increase the alkali solubility and a photo-acid generator; a chemical amplification photoresist comprising a low-molecular weight compound which is decomposed due to an acid to increase the alkali solubility of the photoresist, an alkali-soluble binder, and a photo-acid generator; a chemical amplification photoresist comprising a binder having a group which is decomposed due to an acid to increase the alkali solubility, a low-molecular weight compound which is decomposed due to an acid to increase the alkali solubility of the photoresist, and a photo-acid generator; and a resist containing a metal element. For example, they include trade name: V146G, manufactured by JSR Corporation, trade name: APEX-E, manufactured by Shipley Company, Inc., trade name: PAR710, manufactured by Sumitomo Chemical Co., Ltd., and trade name: AR2772, SEPR430, manufactured by Shin-Etsu Chemical Co., Ltd. Further, they include fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000).

Further, there may be used the resist composition, radiation-sensitive resin 15 composition, the so-called resist composition, e.g., a high resolution patterning composition based on an organometal solution, and metal-containing resist composition, which are disclosed in, for example, WO 2019/188595, WO 2019/187881, WO 2019/187803, WO 2019/167737, WO 2019/167725, WO 2019/187445, WO 2019/167419, WO 2019/123842, WO 2019/054282, WO 2019/058945, WO 2019/058890, WO 2019/039290, WO 2019/044259, WO 2019/044231, WO 2019/026549, WO 2018/193954, WO 2019/172054, WO 2019/021975, WO 2018/230334, WO 2018/194123, JP 2018-180525, WO 2018/190088, JP 2018-070596, JP 2018-028090, JP 2016-153409, JP 2016-130240, JP 2016-108325, JP 2016-047920, JP 2016-035570, JP 2016-035567, JP 2016-035565, JP 2019-101417, JP 2019-117373, JP 2019-052294, JP 2019-008280, JP 2019-008279, JP 2019-003176, JP 2019-003175, JP 2018-197853, JP 2019-191298, JP 2019-061217, JP 2018-045152, JP 2018-022039, JP 2016-090441, JP 2015-10878, JP 2012-168279, JP 2012-022261, JP 2012-022258, JP 2011-043749, JP 2010-181857, and JP 2010-128369, WO 2018/031896, JP 2019-113855, WO 2017/156388, WO 2017/066319, JP 2018-41099, WO 2016/065120, WO 2015/026482, and JP 2016-29498 and JP 2011-253185, but the resist is not limited to these compositions.

Examples of the resist compositions include the followings.

An active light-sensitive or radiation-sensitive resin composition, which comprises a resin A having a repeating unit having an acid decomposable group having a polar group protected by a protecting group capable of being eliminated by the action of an acid, and a compound represented by the following general formula (61):

[Chemical formula 41]

(61)

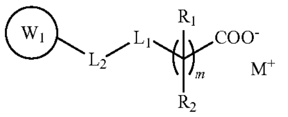

wherein m represents an integer of 1 to 6, each of $R_1$ and $R_2$ independently represents a fluorine atom or a perfluoroalkyl group, $L_1$ represents —O—, —S—, —COO—, —$SO_2$—, or —$SO_3$—, $L_2$ represents an alkylene group optionally having a substituent, or a single bond, $W_1$ represents a cyclic organic group optionally having a substituent, and $M^+$ represents a cation.

A metal-containing film-forming composition for extreme ultraviolet light or electron beam lithography, which comprises a compound having a metal-oxygen covalent bond, and a solvent, wherein the metal element constituting the compound belongs to Periods 3 to 7 of Groups 3 to 15 of the periodic table.

A radiation-sensitive resin composition, which comprises a polymer having a first structural unit represented by the following formula (71) and a second structural unit being represented by the following formula (72) and containing an acid dissociating group, and an acid generator:

[Chemical formula 42]

(71)

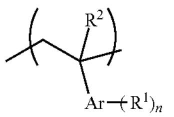

(72)

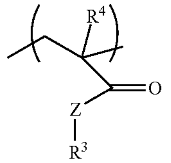

wherein, in formula (71), Ar is a group obtained by removing (n+1) hydrogen atoms from an arene having 6 to 20 carbon atoms, $R^1$ is a hydroxy group, a sulfanyl group, or a monovalent organic group having 1 to 20 carbon atoms, n is an integer of 0 to 11, wherein when n is 2 or more, more than one $R^1$ are the same or different, and $R^2$ is a hydrogen atom, a fluorine atom, a methyl group, or a trifluoromethyl group, and wherein, in formula (72), $R^3$ is a monovalent group having 1 to 20 carbon atoms and containing the acid dissociating group, Z is a single bond, an oxygen atom, or a sulfur atom, and $R^4$ is a hydrogen atom, a fluorine atom, a methyl group, or a trifluoromethyl group.

A resist composition, which comprises a resin (A1) containing a structural unit having a cyclic carbonate structure, a structural unit represented by formula (II), and a structural unit having an acid destabilizing group, and an acid generator:

[Chemical formula 43]

(II)

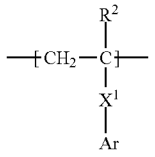

wherein $R^2$ represents an alkyl group having 1 to 6 carbon atoms and optionally having a halogen atom, a hydrogen atom, or a halogen atom, $X^1$ represents a single bond, —CO—O—*, or —CO—$NR^4$—* wherein * represents a bonding site with —Ar, $R^4$ represents a hydrogen atom or an alkyl group having 1 to 4 carbon atoms, and Ar represents an aromatic hydrocarbon group having 6 to 20 carbon atoms and optionally having at least one group selected from the group consisting of a hydroxy group and a carboxyl group.

A resist composition, which generates an acid by exposure and changes in the solubility in a developer due to the action of the acid, wherein the resist composition comprises a base component (A) which changes in the solubility in a developer due to the action of an acid, and a fluorine additive component (F) which has decomposition properties with respect to an alkaline developer, wherein the fluorine additive component (F) comprises a fluorine resin component (F1) having a constitutional unit (f1) containing a base dissociating group and a constitutional unit (f2) containing a group represented by the following general formula (f2-r-1):

[Chemical formula 44]

(f2-r-1)

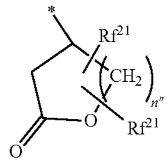

wherein each $Rf^{21}$ is independently a hydrogen atom, an alkyl group, an alkoxy group, a hydroxy group, a hydroxyalkyl group, or a cyano group, n" is an integer of 0 to 2, and * is a bonding site.

The above-mentioned constitutional unit (f1) may contain a constitutional unit represented by the following general formula (f1-1) or a constitutional unit represented by the following general formula (f1-2):

[Chemical formula 45]

(f1-1)

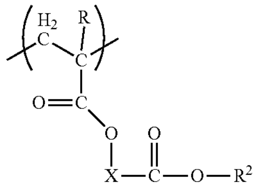

(f1-2)

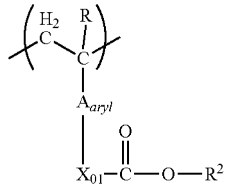

wherein, in formula (f1-1) and (f1-2), each R is independently a hydrogen atom, an alkyl group having 1 to 5 carbon atoms, or a halogenated alkyl group having 1 to 5 carbon atoms, X is a divalent linking group having no acid dissociating site, $A_{aryl}$ is a divalent aromatic cyclic group optionally having a substituent, $X_{01}$ is a single bond or a divalent linking group, and each $R^2$ is independently an organic group having a fluorine atom.

The metal-containing resist composition includes, for example, a coating containing a metal oxo-hydroxo network having an organic ligand through a metal carbon bond and/or a metal carboxylate bond, and an inorganic oxo/hydroxo base composition.

Examples of the resist materials include the followings.

A resist material, which comprises a polymer having a repeating unit represented by the following formula (a1) or (a2):

[Chemical formula 46]

(a1)

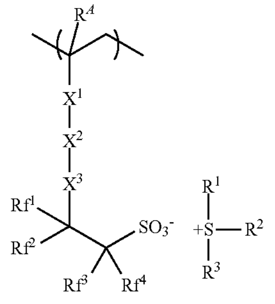

(a2)

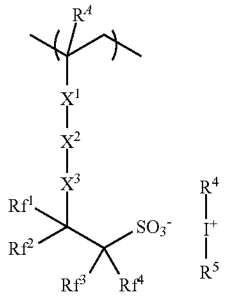

wherein, in formula (a1) and (a2), $R^A$ is a hydrogen atom or a methyl group, $X^1$ is a single bond or an ester group, $X^2$ is a linear, branched, or cyclic alkylene group having 1 to 12 carbon atoms or an arylene group having 6 to 10 carbon atoms, wherein part of the methylene group constituting the alkylene group is optionally substituted with an ether group, an ester group, or a lactone ring-containing group, and wherein at least one hydrogen atom contained in $X^2$ is replaced by a bromine atom, $X^3$ is a single bond, an ether group, an ester group, or a linear, branched, or cyclic alkylene group having 1 to 12 carbon atoms, wherein part of the methylene group constituting the alkylene group is optionally substituted with an ether group or an ester group, each of $Rf^1$ to $Rf^4$ is independently a hydrogen atom, a fluorine atom, or a trifluoromethyl group, wherein at least one of $Rf^1$ to $Rf^4$ is a fluorine atom or a trifluoromethyl group, and wherein $Rf^1$ and $Rf^2$ are optionally bonded together to form a carbonyl group, and each of $R^1$ to $R^5$ is independently a linear, branched, or cyclic alkyl group having 1 to 12 carbon atoms, a linear, branched, or cyclic alkenyl group having 2 to 12 carbon atoms, an alkynyl group having 2 to 12 carbon atoms, an aryl group having 6 to 20 carbon atoms, an aralkyl group having 7 to 12 carbon atoms, or an aryloxyalkyl group having 7 to 12 carbon atoms, wherein part of or all of hydrogen atoms of the above groups are optionally replaced by a hydroxy group, a carboxyl group, a halogen atom, an oxo group, a cyano group, an amido group, a nitro group, a sultone group, a sulfone group, or a sulfonium salt-containing group, wherein part of the methylene group constituting the above groups is optionally substituted with an ether group, an ester group, a carbonyl group, a carbonate group, or a sulfonate group, and wherein $R^1$ and $R^2$ are optionally bonded together with the sulfur atom to which $R^1$ and $R^2$ are bonded, to form a ring.

A resist material, which comprises a base resin containing a polymer having a repeating unit represented by the following formula (81):

[Chemical formula 47]

(81)

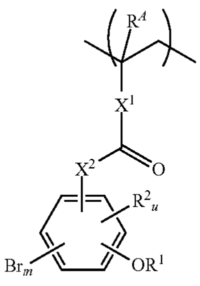

wherein $R^A$ is a hydrogen atom or a methyl group, $R^1$ is a hydrogen atom or an acid destabilizing group, $R^2$ is a linear, branched, or cyclic alkyl group having 1 to 6 carbon atoms, or a halogen atom other than bromine, $X^1$ is a single bond, a phenylene group, or a linear, branched, or cyclic alkylene group having 1 to 12 carbon atoms and optionally having an ester group or a lactone ring, $X^2$ is —O—, —O—$CH_2$—, or —NH—, m is an integer of 1 to 4, and n is an integer of 0 to 3.

Examples of the resist films include the followings.

A resist film, which comprises a base resin having a repeating unit represented by the following formula (91) and/or a repeating unit represented by the following formula (92), and a repeating unit bonded to a polymer principal chain, which generates an acid by exposure:

[Chemical formula 48]

(91)

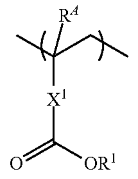

(92)

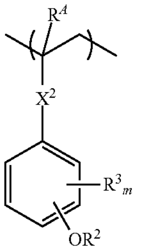

wherein, in formula (91) and (92), each $R^A$ is independently a hydrogen atom or a methyl group, each of $R^1$ and $R^2$ is independently a tertiary alkyl group having 4 to 6 carbon atoms, each $R^3$ is independently a fluorine atom or a methyl group, m is an integer of 0 to 4, $X^1$ is a single bond, a phenylene group, a naphthylene group, or a linking group having 1 to 12 carbon atoms and containing at least one member selected from an ester linkage, a lactone ring, a phenylene group, and a naphthylene group, and $X^2$ is a single bond, an ester linkage, or an amide linkage.

Examples of the coating solutions include the followings.

A coating solution, which comprises an organic solvent; a first organometallic composition, which is represented by the formula: $R_zSnO_{(2-(z/2)-(x/2))}(OH)_x$ (wherein $0<z\leq 2$ and $0<(z+x)\leq 4$), the formula: $R'_nSnX_{4-n}$ (wherein n=1 or 2), or a mixture thereof, wherein each of R and R' is independently a hydrocarbyl group having 1 to 31 carbon atoms, and X is a ligand having a hydrolyzable bond for Sn or a combination thereof; and a hydrolyzable metal compound represented by the formula: $MX'_v$ (wherein M is a metal selected from Groups 2 to 16 of the periodic table of elements, v is a number of 2 to 6, and X' is a ligand having a hydrolyzable M—X bond or a combination thereof).

A coating solution, which comprises an organic solvent and a first organometallic compound represented by the formula: $RSnO_{(3/2-x/2)}(OH)_x$ (wherein $0<x<3$), wherein the solution contains tin in an amount of about 0.0025 to about 1.5 M, and R is an alkyl group or cycloalkyl group having 3 to 31 carbon atoms, wherein the alkyl group or cycloalkyl group is bonded to tin at a secondary or tertiary carbon atom.

They include, for example, an aqueous solution of an inorganic pattern forming precursor, which comprises a mixture of water, metal suboxide cations, polyatomic inorganic anions, and a radiation-sensitive ligand containing a peroxide group.

Exposure through a mask (reticle) for forming a predetermined pattern is conducted, and, for example, an i-line, a KrF excimer laser, an ArF excimer laser, an EUV (extreme ultraviolet light), or an EB (electron beam) is used, and the resist underlayer film-forming composition of the present invention is preferably used in the EUV (extreme ultraviolet light) exposure. In development, an alkaline developer is used, and conditions are appropriately selected from those at a development temperature of 5 to 50° C. for a development time of 10 to 300 seconds. As an alkaline developer may be used, for example, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine. Moreover, an alcohol, such as isopropyl alcohol, or a surfactant, such as a nonionic surfactant may be added to the above-mentioned aqueous alkali solution in an appropriate amount before use. Of these, a preferred developer is a quaternary ammonium salt, and further preferred are tetramethylammonium hydroxide and choline. Furthermore, for example, a surfactant may be added to the above developers. Instead of the method using an alkaline developer, may be used a method, in which development is conducted using an organic solvent, such as butyl acetate, to develop a portion not improved in its alkali dissolution rate of the photoresist. The substrate having the resist patterned may be produced through the above-described steps.

Then, using the formed resist pattern as a mask, the resist underlayer film is subjected to dry etching. In this instance, the surface of the inorganic film is exposed, when the above-mentioned inorganic film is formed on the surface of the semiconductor substrate used, and, the surface of the semiconductor substrate is exposed, when the inorganic film is not formed on the surface of the semiconductor substrate used. Then, the substrate is subjected to the step of processing a substrate by a known method (such as a dry etching method), producing a semiconductor device.

EXAMPLES

Hereinbelow, the present invention will be described in more detail with reference to the following Examples, which should not be construed as limiting the scope of the present invention.

The weight average molecular weight of the polymer shown in the following Synthesis Example 1 and Comparative Synthesis Example 1 in the present specification is the result of the measurement by gel permeation chromatography (hereinafter, referred to simply as "GPC"). In the measurement, a GPC apparatus, manufactured by Tosoh Corp., was used, and the conditions for the measurement and others are as follows.

GPC Column: Shodex KF803L, Shodex KF802, Shodex KF801 [registered trademark] (Showa Denko K.K.)
Column temperature: 40° C.
Solvent: Tetrahydrofuran (THF)
Flow rate: 1.0 ml/minute
Standard sample: Polystyrene (manufactured by Tosoh Corp.)

Synthesis Example 1

3.00 g of monoallyldiglycidylisocyanuric acid (manufactured by Shikoku Chemicals Corporation), 1.91 g of 3,3'-dithiodipropionic acid (trade name: DTDPA, manufactured by Sakai Chemical Industry Co. Ltd.), 0.57 g of adamantanecarboxylic acid (manufactured by Tokyo Chemical Industry Co., Ltd.), and 0.14 g of tetrabutylphosphonium bromide (manufactured by ACROSS Co., Ltd.) were added to 6.87 g of propylene glycol monomethyl ether to dissolve the solids. The reaction vessel was purged with nitrogen gas, and then the reaction was carried out at 105° C. for 8 hours to obtain a polymer solution. Producing no opaque even when cooled to room temperature, the obtained polymer solution had a good solubility in propylene glycol monomethyl ether. GPC analysis made with respect to the obtained solution showed that the polymer had a weight average molecular weight of 5,000, as determined using a conversion calibration curve obtained from the standard polystyrene. The polymer obtained in the present Synthesis Example has structural units represented by the following formulae (1a), (2a), and (3a).

[Chemical formula 49]

(1a)

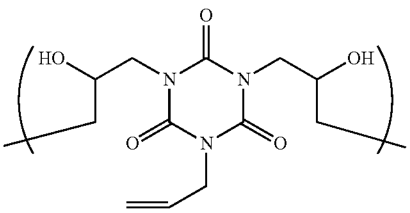

(2a)

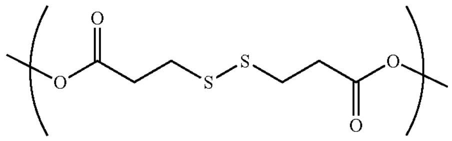

(3a)

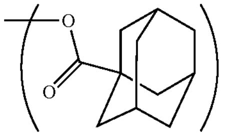

Example 1

Into 2.60 g of a polymer solution containing 0.45 g of the polymer obtained in Synthesis Example 1 were mixed 0.50 g of tetramethoxymethylglycoluril (manufactured by Nihon Cytec Industries Inc.), 0.10 g of pyridinium p-phenolsulfonate (manufactured by Tokyo Chemical Industry Co., Ltd.), and 0.20 g of bis[4-(2-hydroxyethoxy)phenyl] sulfone (1b) (manufactured by Tokyo Chemical Industry Co., Ltd.). To the resultant mixture were added 26.30 g of propylene glycol monomethyl ether and 2.99 g of propylene glycol monomethyl ether acetate to dissolve the solids. Thereafter, the resultant solution was subjected to filtration using a polyethylene microfilter having a pore diameter of 0.05 μm to prepare a resist underlayer film-forming composition for lithography.

[Chemical formula 50]

(1b)

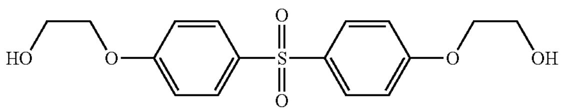

Example 2

Into 0.26 g of a polymer solution containing 0.045 g of the polymer obtained in Synthesis Example 1 were mixed 0.05 g of tetramethoxymethylglycoluril (manufactured by Nihon Cytec Industries Inc.), 0.01 g of pyridinium p-phenolsulfonate (manufactured by Tokyo Chemical Industry Co., Ltd.), and 0.02 g of bis[4-(2-hydroxyethoxy)phenyl] sulfone (1b) (manufactured by Tokyo Chemical Industry Co., Ltd.). To the resultant mixture were added 26.30 g of propylene glycol monomethyl ether and 2.99 g of propylene glycol monomethyl ether acetate to dissolve the solids. Thereafter, the resultant solution was subjected to filtration using a polyethylene microfilter having a pore diameter of 0.05 μm to prepare a resist underlayer film-forming composition for lithography.

Comparative Example 1

Into 2.60 g of a polymer solution containing 0.45 g of the polymer obtained in Synthesis Example 1 were mixed 0.50 g of tetramethoxymethylglycoluril (manufactured by Nihon Cytec Industries Inc.) and 0.10 g of pyridinium p-phenolsulfonate (manufactured by Tokyo Chemical Industry Co., Ltd.). To the resultant mixture were added 26.30 g of propylene glycol monomethyl ether and 2.99 g of propylene glycol monomethyl ether acetate to dissolve the solids. Thereafter, the resultant solution was subjected to filtration using a polyethylene microfilter having a pore diameter of 0.05 μm to prepare a resist underlayer film-forming composition for lithography.

Comparative Example 2

Into 0.26 g of a polymer solution containing 0.045 g of the polymer obtained in Synthesis Example 1 were mixed 0.05 g of tetramethoxymethylglycoluril (manufactured by Nihon Cytec Industries Inc.) and 0.01 g of pyridinium p-phenolsulfonate (manufactured by Tokyo Chemical Industry Co., Ltd.). To the resultant mixture were added 26.30 g of propylene glycol monomethyl ether and 2.99 g of propylene glycol monomethyl ether acetate to dissolve the solids. Thereafter, the resultant solution was subjected to filtration using a polyethylene microfilter having a pore diameter of 0.05 μm to prepare a resist underlayer film-forming composition for lithography.

Comparative Example 3

Into 2.60 g of a polymer solution containing 0.45 g of the polymer obtained in Synthesis Example 1 were mixed 0.50 g of tetramethoxymethylglycoluril (manufactured by Nihon Cytec Industries Inc.), 0.10 g of pyridinium p-phenolsulfonate (manufactured by Tokyo Chemical Industry Co., Ltd.), and 0.20 g of bisphenol S (2b) (manufactured by Tokyo Chemical Industry Co., Ltd.). To the resultant mixture were added 26.30 g of propylene glycol monomethyl ether and 2.99 g of propylene glycol monomethyl ether acetate to dissolve the solids. Thereafter, the resultant solution was subjected to filtration using a polyethylene microfilter having a pore diameter of 0.05 μm to prepare a resist underlayer film-forming composition for lithography.

[Chemical formula 51]

(2b)

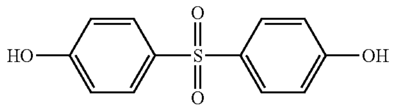

Comparative Example 4

Into 0.26 g of a polymer solution containing 0.045 g of the polymer obtained in Synthesis Example 1 were mixed 0.05 g of tetramethoxymethylglycoluril (manufactured by Nihon Cytec Industries Inc.), 0.01 g of pyridinium p-phenolsulfonate (manufactured by Tokyo Chemical Industry Co., Ltd.), and 0.02 g of bisphenol S (2b) (manufactured by Tokyo Chemical Industry Co., Ltd.). To the resultant mixture were added 26.30 g of propylene glycol monomethyl ether and 2.99 g of propylene glycol monomethyl ether acetate to dissolve the solids. Thereafter, the resultant solution was subjected to filtration using a polyethylene microfilter having a pore diameter of 0.05 μm to prepare a resist underlayer film-forming composition for lithography.

[Test for Dissolution into a Photoresist Solvent]

Each of the resist underlayer film-forming compositions in Examples 1 and 2 and Comparative Examples 1 to 4 was applied by a spinner onto a silicon wafer which is a semiconductor substrate. The silicon wafer was placed on a hotplate and baked at 205° C. for one minute to form a resist underlayer film (thickness: 5 nm). The formed resist underlayer film was immersed in ethyl lactate and propylene glycol monomethyl ether, which are the solvent used in the photoresist, to check that the film was insoluble in these solvents.

[Measurement of a Sublimate Amount]

The measurement of a sublimate amount was conducted using the sublimate amount measurement apparatus described in WO 2007/111147 A1. Each of the resist underlayer film-forming compositions prepared in Example 1 and Comparative Examples 1 and 3 was first applied by a spin coater onto a silicon wafer substrate having a diameter of 4 inches so that the composition applied had a thickness of 50 nm. The wafer having the resist underlayer film applied was set in the sublimate amount measurement apparatus having a hotplate united, and baked for 120 seconds to collect a sublimate on a QCM (quartz crystal microbalance) sensor, i.e., a quartz crystal unit having an electrode formed thereon. The QCM sensor has properties such that when a sublimate is deposited on the surface (electrode) of the quartz crystal unit, the frequency of the quartz crystal unit is changed (reduced) according to the mass of the sublimate, and permits detecting a very small change of a mass utilizing such properties. The detailed procedure for measurement was as follows. The temperature of the hotplate of the sublimate amount measurement apparatus was increased to the measurement temperature shown in Table 1, and the pump flow rate was set at 1 $m^3$/s, and the apparatus was left standing still for the first 60 seconds for stabilizing the apparatus. Immediately after the stabilization, the wafer covered with a resist underlayer film was quickly moved through a slide inlet and placed on the hotplate, and a sublimate was collected from the time point of 60 seconds to a time point of 180 seconds (for a period of 120 seconds). A nozzle was not fitted to a flow attachment (detecting part) which was a connection between the QCM sensor of the sublimate amount measurement apparatus and the collecting funnel part, and therefore, from a channel (bore diameter: 32 mm) of a chamber unit having a distance of 30 mm from the sensor (quartz crystal unit), a gas flow went into the sensor without being narrowed. In the QCM sensor used, a material (AlSi) having silicon and aluminum as main components was used as the electrode, the quartz crystal unit had a diameter (sensor diameter) of 14 mm, the quartz crystal unit surface had an electrode diameter of 5 mm, and the resonant frequency was 9 MHz. The obtained change of the frequency was converted to a value on a gram basis from the inherent value of the quartz crystal unit used in the measurement, so that the relationship between the baking temperature and the sublimate amount of one wafer to which the resist underlayer film is applied was clarified. The time period of the first 60 seconds was the duration for stabilizing the apparatus (the wafer is not set), and thus the value measured from a point in time when the wafer was placed on the hotplate, i.e., a time point of 60 seconds to a time point of 180 seconds corresponded to a measured value for the sublimate amount of the wafer. The sublimate amount of the resist underlayer film quantitatively determined by the apparatus is shown as a sublimate amount ratio in Table 1 below. The sublimate amount ratio is expressed by a standardized value when taking the sublimate amount generated from the resist underlayer film in Comparative Example 3 as 1.00. The results clearly showed that, as compared to the resist underlayer film in Comparative Example 3 (containing the compound represented by formula (2b)), the resist underlayer film in Example 1 (containing the compound represented by formula (1b)) had a possibility of markedly reducing the sublimate generated during baking.

TABLE 1

| | Sublimate amount ratio |
|---|---|
| Example 1 | 0.52 |
| Comparative Example 1 | 0.48 |
| Comparative Example 3 | 1.00 |

[Formation of a Resist Pattern by Electron Beam Lithography System]

Each of the resist underlayer film-forming compositions in Example 2 and Comparative Examples 2 and 4 was applied onto a silicon wafer using a spinner. The silicon wafer was baked on a hotplate at 205° C. for 60 seconds to obtain a resist underlayer film having a thickness of 5 nm. An EUV positive resist solution (containing a methacrylic polymer) was applied by spin coating onto the obtained resist underlayer film, and heated at 130° C. for 60 seconds to form an EUV resist film. The formed resist film was subjected to exposure under the predetermined conditions using an electron beam lithography system (ELS-G130). After the exposure, the resist film was baked (PEB) at 100° C. for 60 seconds, cooled to room temperature on a cooling plate, subjected to development using an alkaline developer (2.38% TMAH), and then a 25 nm line/50 nm pitch resist pattern was formed. In the measurement of the length of the resist pattern, a scanning electron microscope (CG4100, manufactured by Hitachi High-Technologies Corporation) was used. In the formation of the resist pattern, the exposure energy with which a 25 nm line/50 nm pitch (line and space (L/S=1/1) was formed was defined as the optimum exposure energy.

The thus obtained photoresist pattern was observed from above the pattern and evaluated. The exposure energy required for forming a 25 nm line of the resist pattern and LWR are shown in Table 2. From the results, in Example 2, reduction of the exposure energy required for forming a 25 nm pattern (improvement of the sensitivity) and improvement of LWR were found, as compared to Comparative Examples 2 and 4. The above results showed that the resist underlayer film containing the compound represented by formula (1b) exhibits the above advantages, as compared to the resist underlayer film containing the compound represented by formula (2b). The reason for this is presumed that, as compared to the compound represented by formula (2b), the compound represented by formula (1b) is bonded to the polymer contained in the resist underlayer film, and thus the ratio of the amount of the compound remaining in the film is higher.

TABLE 2

| | 25 nm Pattern exposure energy | Exposure energy standardized value | LWR |
|---|---|---|---|
| Example 2 | 350 μC | 0.97 | 3.94 nm |
| Comparative Example 2 | 359 μC | 1.00 | 4.02 nm |
| Comparative Example 4 | 360 μC | 1.00 | 4.05 nm |

INDUSTRIAL APPLICABILITY

The resist underlayer film-forming composition of the present invention makes it possible to provide a composition for forming a resist underlayer film that is capable of forming a desired resist pattern, a method for producing a substrate having a resist pattern using the resist underlayer film-forming composition, and a method for producing a semiconductor device.

The invention claimed is:

1. An EUV resist underlayer film-forming composition comprising:

a compound represented by the following formula (1):

Formula (1)

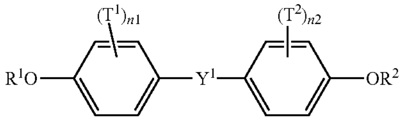

wherein:

$Y^1$ represents a single bond, an oxygen atom, a sulfur atom, an alkylene group having 1 to 10 carbon atoms and optionally being substituted with a halogen atom or an aryl group having 6 to 40 carbon atoms, or a sulfonyl group, $T^1$ and $T^2$ represent an alkyl group having 1 to 10 carbon atoms, $R^1$ and $R^2$ independently represent an alkyl group having 1 to 10 carbon atoms and being substituted with at least one hydroxy group, and n1 and n2 independently represent an integer of 0 to 4, a polymer, wherein the polymer has an end blocked by a compound containing an aliphatic ring that optionally bas a carbon-carbon bond interrupted by a heteroatom and is optionally substituted with a substituent, and an organic solvent.

2. The EUV resist underlayer film-forming composition according to claim 1, wherein $Y^1$ is a sulfonyl group.

3. The EUV resist underlayer film-forming composition according to claim 1, wherein the polymer comprises a heterocyclic structure.

4. The EUV resist underlayer film-forming composition according to claim 1, further comprising a crosslinking agent.

5. The EUV resist underlayer film-forming composition according to claim 1, further comprising a crosslinking catalyst.

6. An EUV resist underlayer film which is a baked product of an applied film comprising the EUV resist underlayer film-forming composition according to claim 1.

7. A method for producing a patterned substrate, comprising the steps of:

applying the EUV resist underlayer film-forming composition according to claim 1 onto a semiconductor substrate and baking the applied composition to form an EUV resist underlayer film;

applying an EUV resist onto the EUV resist underlayer film and baking the applied resist to form an EUV resist film;

irradiating the semiconductor substrate covered with the EUV resist underlayer film and the EUV resist with a light or an electron beam; and subjecting the exposed EUV resist film to development and patterning.

8. A method for producing a semiconductor device, comprising the steps of:

forming an EUV resist underlayer film comprising the EUV resist underlayer film-forming composition according to claim 1 on a semiconductor substrate;

forming an EUV resist film on the EUV resist underlayer film;

irradiating the EUV resist film with a light or an electron beam followed by development to form an EUV resist pattern;

subjecting the EUV resist underlayer film to etching through the formed EUV resist pattern to form a patterned EUV resist underlayer film; and processing the semiconductor substrate using the patterned EUV resist underlayer film.

* * * * *